(12) United States Patent
Shiraishi et al.

(10) Patent No.: US 11,363,706 B2
(45) Date of Patent: Jun. 14, 2022

(54) TARGET SUPPLY DEVICE, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Yutaka Shiraishi, Oyama (JP);
Toshihiro Nishisaka, Oyama (JP);
Tsukasa Hori, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/333,538

(22) Filed: May 28, 2021

(65) Prior Publication Data
US 2022/0015218 A1    Jan. 13, 2022

(30) Foreign Application Priority Data
Jul. 13, 2020  (JP) .............................. JP2020-120078

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/008* (2013.01)

(58) Field of Classification Search
None
See application file for complete search history.

(56) References Cited

U.S. PATENT DOCUMENTS

| 7,872,245 | B2 | 1/2011 | Vaschenko et al. |
| 8,610,095 | B2 | 12/2013 | Yabu et al. |
| 2014/0217310 | A1* | 8/2014 | Hirashita ............... H05G 2/006 250/493.1 |

(Continued)

FOREIGN PATENT DOCUMENTS

| JP | 2015-218871 A | 12/2015 |
| WO | WO-2017187630 A1 * | 11/2017 ......... G03F 7/70033 |

OTHER PUBLICATIONS

A Search Report issued by the Netherlands Patent Office dated Apr. 20, 2022, which corresponds to Dutch Patent Application No. 2028391 and is related to U.S. Appl. No. 17/333,538; with partial English language explanation.

*Primary Examiner* — Michelle M Iacoletti
(74) *Attorney, Agent, or Firm* — Studebaker & Brackett PC

(57) ABSTRACT

A target supply device may include a first containing member configured to contain a target substance; a second containing member configured to contain the target substance flowing from the first containing member; a ring-shaped sealing portion which is formed integrally with one of the first containing member and the second containing member, and is brought into close contact with the other containing member; and a fastening member which fastens the first containing member and the second containing member to each other so that the first containing member communicates with the second containing member through the communication portion, and presses the sealing portion against the other containing member. Here, the sealing portion being plastically deformed by being pressed against the other containing member by the fastening member to seal a gap between the first containing member and the second containing member around the communication portion due to the plastic deformation.

15 Claims, 17 Drawing Sheets

(56) References Cited

U.S. PATENT DOCUMENTS

2015/0144809 A1    5/2015  Okazaki et al.
2017/0280543 A1    9/2017  Hori et al.
2019/0008026 A1*  1/2019  Hirashita ............... H05G 2/006

* cited by examiner

TARGET SUPPLY DEVICE, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application claims the benefit of Japanese Patent Application No. 2020-120078, filed on Jul. 13, 2020, the entire contents of which are hereby incorporated by reference.

BACKGROUND

1. Technical Field

The present disclosure relates to a target supply device, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: U.S. Pat. No. 7,872,245
Patent Document 2: U.S. Pat. No. 8,610,095
Patent Document 3: Japanese Patent Publication No. 2015-218871

SUMMARY

A target supply device according to an aspect of the present disclosure includes a first containing member configured to contain a target substance; a second containing member configured to contain the target substance flowing from the first containing member; a ring-shaped sealing portion which is formed integrally with one of the first containing member and the second containing member, extends from the one containing member toward the other containing member, surrounds entire circumference of a communication portion between the first containing member and the second containing member, and is brought into close contact with the other containing member; and a fastening member which fastens the first containing member and the second containing member to each other so that the first containing member communicates with the second containing member through the communication portion, and presses the sealing portion against the other containing member. Here, the sealing portion is plastically deformed by being pressed against the other containing member by the fastening member to seal a gap between the first containing member and the second containing member around the communication portion due to the plastic deformation.

An extreme ultraviolet light generation apparatus according to an aspect of the present disclosure includes a chamber device including a plasma generation region, a target supply device configured to supply a target substance to the plasma generation region, and a laser device configured to irradiate the target substance with laser light so that plasma is generated from the target substance in the plasma generation region. Here, the target supply device includes a first containing member configured to contain the target substance; a second containing member configured to contain the target substance flowing from the first containing member; a ring-shaped sealing portion which is formed integrally with one of the first containing member and the second containing member, extends from the one containing member toward the other containing member, surrounds entire circumference of a communication portion between the first containing member and the second containing member, and is brought into close contact with the other containing member; and a fastening member which fastens the first containing member and the second containing member to each other so that the first containing member communicates with the second containing member through the communication portion, and presses the sealing portion against the other containing member. The sealing portion is plastically deformed by being pressed against the other containing member by the fastening member to seal a gap between the first containing member and the second containing member around the communication portion due to the plastic deformation.

An electronic device manufacturing method according to an aspect of the present disclosure includes generating plasma by irradiating a target substance with laser light using an extreme ultraviolet light generation apparatus, emitting extreme ultraviolet light generated from the plasma to an exposure apparatus, and exposing a photosensitive substrate to the extreme ultraviolet light in the exposure apparatus to manufacture an electronic device. Here, the extreme ultraviolet light generation apparatus includes a chamber device including a plasma generation region, a target supply device configured to supply the target substance to the plasma generation region, and a laser device configured to irradiate the target substance with the laser light so that the plasma is generated from the target substance in the plasma generation region. The target supply device includes a first containing member configured to contain the target substance; a second containing member configured to contain the target substance flowing from the first containing member; a ring-shaped sealing portion which is formed integrally with one of the first containing member and the second containing member, extends from the one containing member toward the other containing member, surrounds entire circumference of a communication portion between the first containing member and the second containing member, and is brought into close contact with the other containing member; and a fastening member which fastens the first containing member and the second containing member to each other so that the first containing member communicates with the second containing member through the communication portion, and presses the sealing portion against the other containing member. The sealing portion is plastically deformed by being pressed against the other containing member by the fastening member to seal a gap between the first containing member and the second containing member around the communication portion due to the plastic deformation.

BRIEF DESCRIPTION OF THE DRAWINGS

Embodiments of the present disclosure will be described below merely as examples with reference to the accompanying drawings.

DESCRIPTION OF EMBODIMENTS

Figure 1:
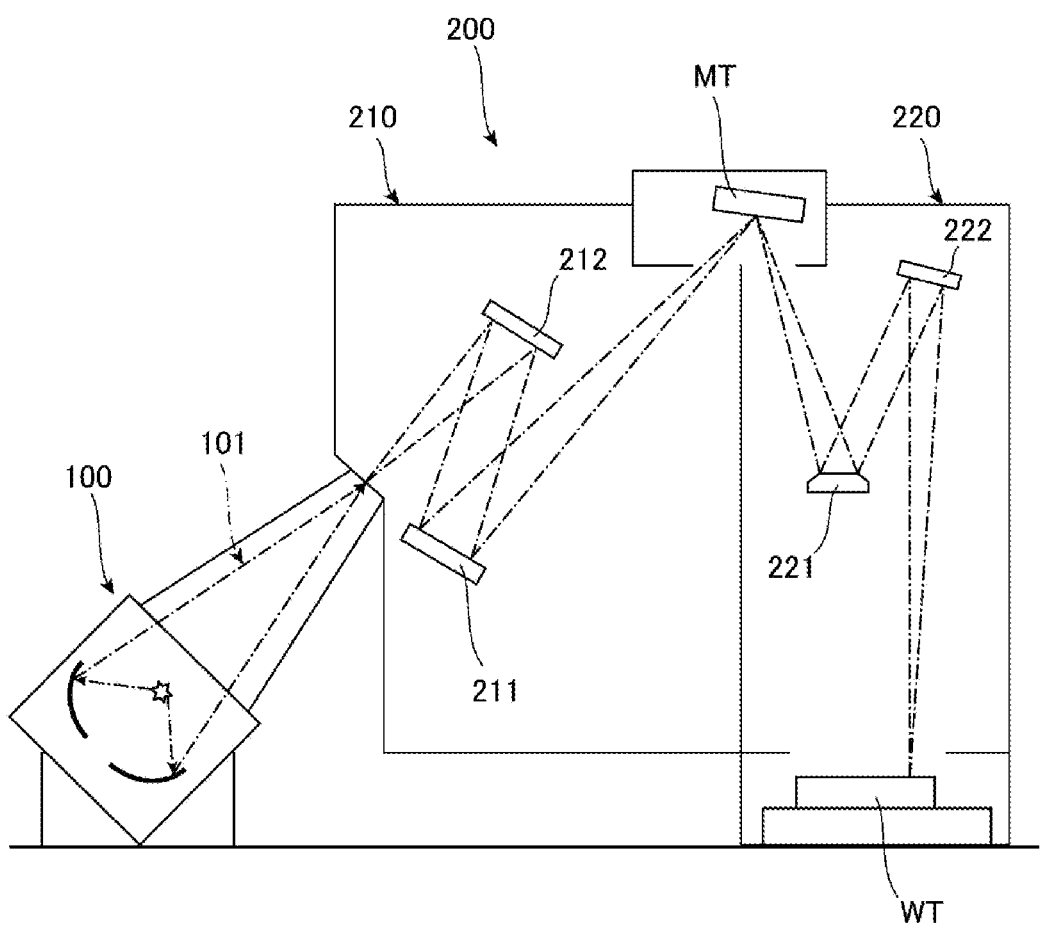
FIG. 1 is a schematic view showing an exemplary entire schematic configuration of an electronic device manufacturing apparatus.

1. Overview
2. Description of electronic device manufacturing apparatus
3. Description of extreme ultraviolet light generation apparatus of comparative example
   3.1 Configuration
   3.2 Operation
   3.3 Problem
4. Description of target supply device of first embodiment
   4.1 Configuration
   4.2 Effect
5. Description of target supply device of second embodiment
   5.1 Configuration
   5.2 Effect
6. Description of target supply device of third embodiment
   6.1 Configuration
   6.2 Effect
7. Description of target supply device of fourth embodiment
   7.1 Configuration
   7.2 Effect Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) and an electronic device manufacturing apparatus. In the following, extreme ultraviolet light is referred to as EUV light in some cases.

2. Description of Electronic Device Manufacturing Apparatus

As shown in FIG. 1, an electronic device manufacturing apparatus includes an EUV light generation apparatus 100 and an exposure apparatus 200. The exposure apparatus 200 includes a mask irradiation unit 210 including a plurality of mirrors 211, 212 and a workpiece irradiation unit 220 including a plurality of mirrors 221, 222. The mask irradiation unit 210 irradiates a mask pattern on a mask table MT through a reflection optical system with EUV light 101 incident from the EUV light generation apparatus 100. The workpiece irradiation unit 220 images the EUV light 101 reflected by the mask table MT onto a workpiece (not shown) disposed on the workpiece table WT through a reflection optical system. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

3. Description of Extreme Ultraviolet Light Generation Apparatus of Comparative Example 3.1 Configuration The EUV light generation apparatus 100 of a comparative example will be described. The comparative example of the present disclosure is an example recognized by the applicant as known only by the applicant, and is not a publicly known example admitted by the applicant.

Figure 2:
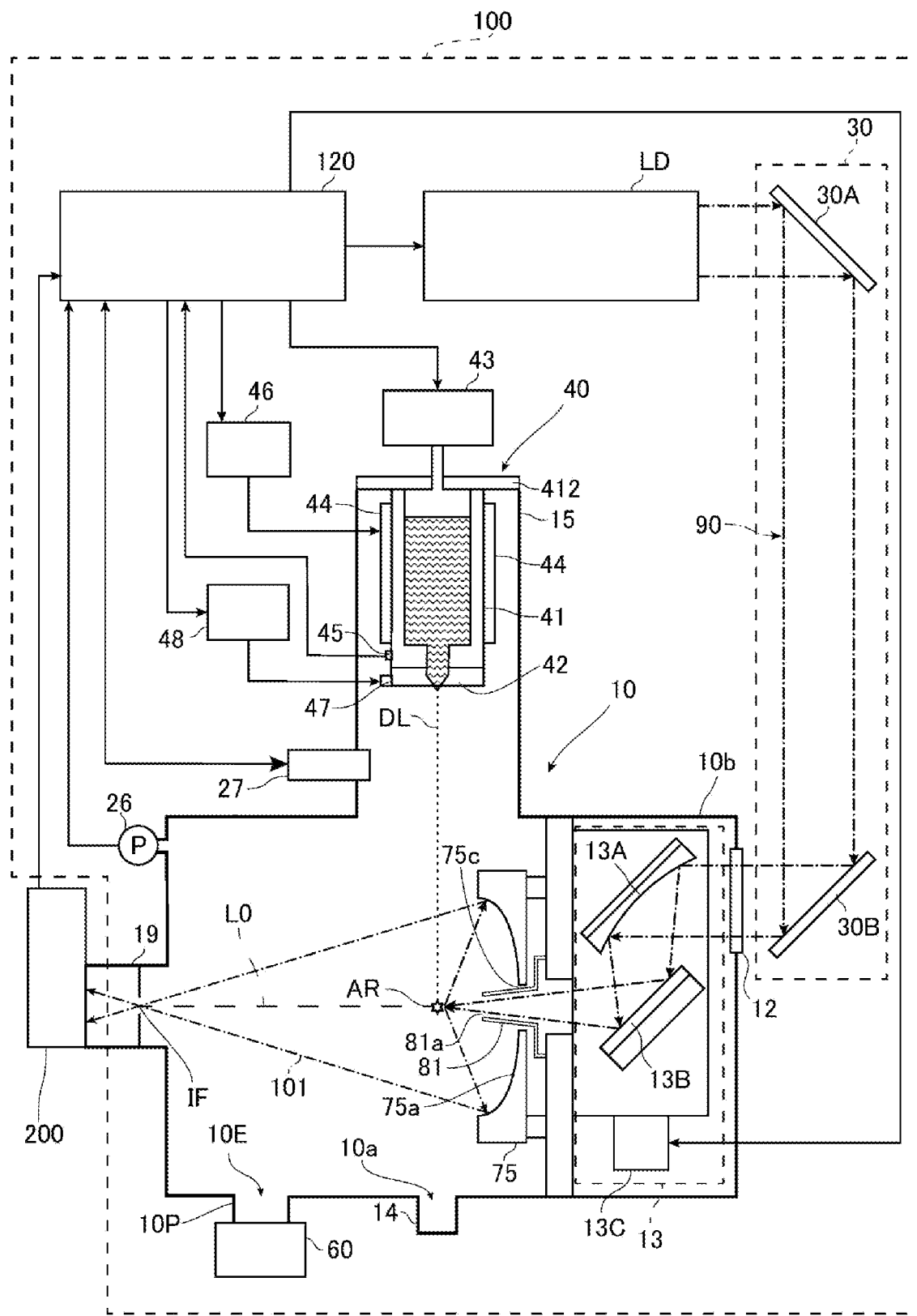
FIG. 2 is a schematic view showing an exemplary entire schematic configuration of an extreme ultraviolet light generation apparatus.

FIG. 2 is a view showing an exemplary entire schematic configuration of the EUV light generation apparatus 100 of the present example. As shown in FIG. 2, the EUV light generation apparatus 100 includes a laser device LD, a chamber device 10, a processor 120, and a laser light delivery optical system 30 as a main configuration. In FIG. 2, some of the configuration of the EUV light generation apparatus 100, such as a sealing member 500 and a fastening member 600 to be described later, is omitted.

The chamber device 10 is a sealable container. The chamber device 10 includes an inner wall 10b surrounding an internal space having a low pressure atmosphere. The chamber device 10 includes a sub-chamber 15 and a target supply device 40 is provided in the sub-chamber 15. The target supply device 40 is attached to penetrate through a wall of the sub-chamber 15. The target supply device 40 includes a tank 41 and a nozzle 42, and supplies droplets DL to the internal space of the chamber device 10. The droplet DL is also referred to as a target.

The tank 41 stores therein a target substance which becomes the droplet DL. The target substance contains tin. The inside of the tank 41 communicates, through a pipe, with a pressure adjuster 43 which adjusts gas pressure. A heater 44 and a temperature sensor 45 are attached to the tank. The heater 44 heats the tank 41 with current applied from a heater power source 46. Through the heating, the target substance in the tank 41 melts. The temperature sensor 45 measures the temperature of the target substance in the tank 41 through the tank 41. The pressure adjuster 43, the temperature sensor 45, and the heater power source 46 are electrically connected to the processor 120.

The nozzle 42 is attached to the tank 41 and discharges the target substance. A piezoelectric element 47 is attached to the nozzle 42. The piezoelectric element 47 is electrically connected to a piezoelectric power source 48 and is driven by voltage applied from the piezoelectric power source 48. The piezoelectric power source 48 is electrically connected to the processor 120. The target substance discharged from the nozzle 42 is formed into the droplet DL through operation of the piezoelectric element 47.

The chamber device 10 also includes a target collection unit 14. The target collection unit 14 is a box body attached to the inner wall 10b of the chamber device 10. The target collection unit 14 communicates with the internal space of the chamber device 10 through an opening 10a continued to the inner wall 10b of the chamber device 10. The target collection unit 14 and the opening 10a are disposed directly below the nozzle 42. The target collection unit 14 is a drain tank to collect any unnecessary droplet DL passing through the opening 10a and reaching the target collection unit 14 and to accumulate the unnecessary droplet DL.

At least one through hole is formed in a wall of the chamber device 10. The through hole is blocked by a window 12 through which pulsed laser light 90 emitted from the laser device LD passes.

Further, a laser light concentrating optical system 13 is located in the internal space of the chamber device 10. The laser light concentrating optical system 13 includes a laser light concentrating mirror 13A and a high reflection mirror 13B. The laser light concentrating mirror 13A reflects and concentrates the laser light 90 passing through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a laser light concentrating position at the internal space of the chamber device 10 coincides with a position specified by the processor 120.

For example, an EUV light concentrating mirror 75 having a spheroidal reflection surface 75a is disposed at the internal space of the chamber device 10. The reflection surface 75a reflects the EUV light 101 generated from the plasma in a plasma generation region AR. The reflection surface 75a has a first focal point and a second focal point. The reflection surface 75a may be disposed such that, for example, the first focal point is located in the plasma generation region AR and the second focal point is located at an intermediate focal point IF. In FIG. 2, a straight line passing through the first focal point and the second focal point is shown as a focal line L0.

Further, the EUV light generation apparatus 100 includes a connection portion 19 providing communication between the internal space of the chamber device 10 and an internal space of the exposure apparatus 200. A wall in which an aperture is formed is provided inside the connection portion 19. The wall is preferably arranged such that the aperture is located at the second focal point.

Further, the EUV light generation apparatus 100 includes a pressure sensor 26 and a target sensor 27. The pressure sensor 26 and the target sensor 27 are attached to the chamber device 10 and are electrically connected to the processor 120. The pressure sensor 26 measures pressure in the internal space of the chamber device 10. The target sensor 27 has, for example, an imaging function, and detects the presence, trajectory, position, speed, and the like of the droplet DL according to an instruction from the processor 120.

The laser device LD includes a master oscillator being a light source to perform burst operation. The master oscillator emits the pulsed laser light 90 in a burst-on duration. The master oscillator is, for example, a laser device configured to emit the laser light 90 by exciting, through electric discharge, gas as mixture of carbon dioxide gas with helium, nitrogen, or the like. Alternatively, the master oscillator may be a quantum cascade laser device. The master oscillator may emit the pulsed laser light 90 by a Q switch system. Further, the master oscillator may include an optical switch, a polarizer, and the like. In the burst operation, the continuous pulsed laser light 90 is emitted at a predetermined repetition frequency in the burst-on duration and the emission of the laser light 90 is stopped in a burst-off duration.

The travel direction of the laser light 90 emitted from the laser device LD is adjusted by the laser light delivery optical system 30. The laser light delivery optical system 30 includes a plurality of mirrors 30A and 30B for adjusting a travel direction of the laser light 90, and a position of at least one of the mirrors 30A and 30B is adjusted by an actuator (not shown). Owing to that the position of at least one of the mirrors 30A and 30B is adjusted, the laser light 90 can appropriately propagate to the internal space of the chamber device 10 through the window 12.

The processor 120 is a processing device including a storage device in which a control program is stored and a CPU which executes the control program. The processor 120 is specifically configured or programmed to perform various processes included in the present disclosure. The processor 120 controls several configurations of the EUV light generation apparatus 100. Further, the processor 120 controls the entire EUV light generation apparatus 100. The processor 120 receives a signal related to the pressure in the internal space of the chamber device 10, which is measured by the pressure sensor 26, a signal related to image data of the droplet DL captured by the target sensor 27, a burst signal from the exposure apparatus 200, and the like. The processor 120 processes the image data and the like, and may control, for example, timing at which the droplet DL is output, an output direction of the droplet DL, and the like. Further, the processor 120 may control oscillation timing of the laser device LD, the travel direction of the laser light 90, the concentrating position of the laser light 90, and the like. Such various kinds of control described above are merely exemplary, and other control may be added as necessary, as described later.

A central gas supply unit 81 for supplying an etching gas to the internal space of the chamber device 10 is disposed at the chamber device 10. As described above, since the target substance contains tin, the etching gas is, for example, hydrogen-containing gas having a hydrogen gas concentration of 100% in effect. Alternatively, the etching gas may be, for example, a balance gas having a hydrogen gas concentration of about 3%. The balance gas contains nitrogen ($N_2$) gas and argon (Ar) gas. Tin fine particles and tin charged particles are generated when the target substance forming the droplet DL is turned into plasma in the plasma generation region AR by being irradiated with the laser light 90. The etching gas contains hydrogen which reacts with tin constituting the fine particles and charged particles. Through the reaction with hydrogen, tin becomes stannane ($SnH_4$) gas at room temperature.

The central gas supply unit 81 has a shape of a side surface of a circular truncated cone and is called a cone in some cases. The central gas supply unit 81 is inserted through a through hole 75c formed in the center of the EUV light concentrating mirror 75.

The central gas supply unit 81 has a central gas supply port 81a being a nozzle. A central gas supply port 81a is provided on the focal line L0 passing through the first focal point and the second focal point of the reflection surface 75a. The focal line L0 is extended along the center axis direction of the reflection surface 75a.

The central gas supply port 81a supplies the etching gas from the center side of the reflection surface 75a toward the plasma generation region AR. The central gas supply port 81a preferably supplies the etching gas in the direction away from the reflection surface 75a from the center side of the reflection surface 75a along the focal line L0. The central gas supply port 81a is connected to a gas supply device (not shown) being a tank for supplying the etching gas through a pipe (not shown) of the central gas supply unit 81. The gas supply device is driven and controlled by the processor 120. A supply gas flow rate adjusting unit (not shown) may be provided in the pipe (not shown).

The central gas supply port 81a is a gas supply port for supplying the etching gas to the internal space of the chamber device 10 as well as an emission port through which the laser light 90 is emitted to the internal space of the chamber device 10. The laser light 90 travels toward the internal space of the chamber device 10 through the window 12 and the central gas supply port 81a.

An exhaust port 10E is continued to the inner wall 10b of the chamber device 10. Since the exposure apparatus 200 is disposed on the focal line L0, the exhaust port 10E is disposed not on the focal line L0 but on the inner wall 10b on the lateral side to the focal line L0. The direction along the center axis of the exhaust port 10E is perpendicular to the focal line L0. The exhaust port 10E is provided on the side opposite to the reflection surface 75a with respect to the plasma generation region AR when viewed from the direction perpendicular to the focal line L0. The exhaust port 10E exhausts residual gas to be described later in the internal space of the chamber device 10. The exhaust port 10E is connected to an exhaust pipe 10P, and the exhaust pipe 10P is connected to an exhaust pump 60.

When the target substance is turned into plasma, the residual gas as exhaust gas is generated in the internal space of the chamber device 10. The residual gas contains tin fine particles and tin charged particles generated through the plasma generation from the target substance, stannane generated through the reaction of the tin fine particles and tin charged particles with the etching gas, and unreacted etching gas. Some of the charged particles are neutralized in the internal space of the chamber device 10, and the residual gas contains the neutralized charged particles as well. The exhaust pump 60 sucks the residual gas through the exhaust port 10E and the exhaust pipe 10P.

Next, the configuration of the target supply device 40 will be described in more detail.

Figure 3:
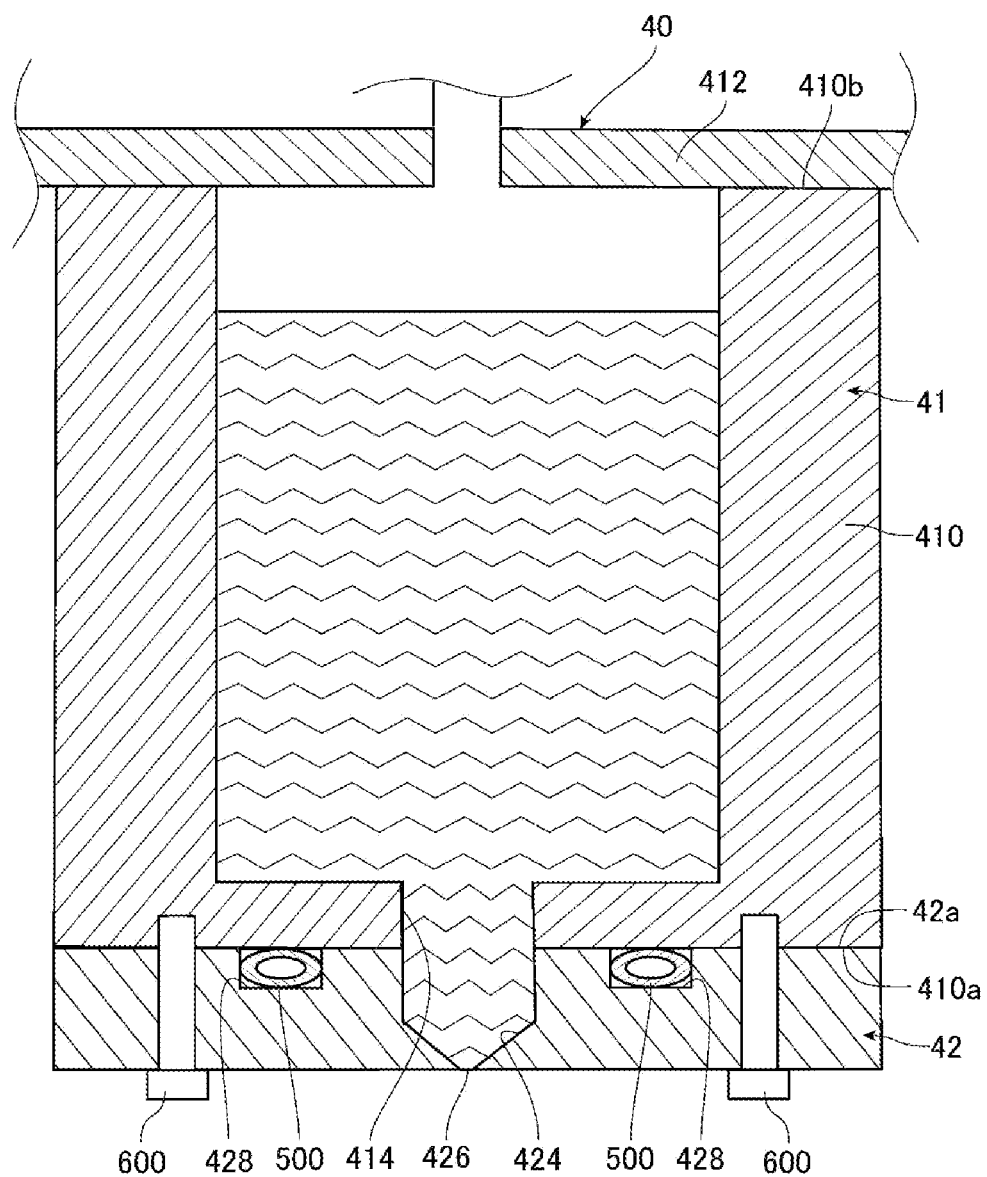
FIG. 3 is a schematic view showing an exemplary schematic configuration of a part including a target supply device of a comparative example.

FIG. 3 is a schematic view showing an exemplary schematic configuration of a part including the target supply device 40 in the comparative example. In FIG. 3, some of the configuration of the target supply device 40, such as the pressure adjuster 43, the heater 44, and the temperature sensor 45, is omitted.

First, the tank 41 will be described. The tank 41 includes a tank main body 410 and a lid body 412.

The tank main body 410 is a casing for storing the melted target substance at the internal space thereof, and is a first containing member for containing the target substance. The circumferential surface of the tank main body 410 has a circumferential shape of a cylinder. A tank flow path 414 through which the target substance flows from the internal space of the tank main body 410 toward the nozzle 42 is arranged at the bottom of the tank main body 410. In the comparative example, the tank flow path 414 is a first flow path, and the tank main body 410 is a first flow path member including the first flow path as well. The center axis of the tank flow path 414 is arranged coaxially with the center axis of the tank main body 410. The tank flow path 414 communicates with an opening on a bottom surface 410a of the tank main body 410.

The lid body 412 covers the opening of an upper surface 410b of the tank main body 410 and a periphery portion of the opening. The lid body 412 is fixed to the tank main body 410 by a plurality of fastening members (not shown) being screwed into the tank main body 410 and the lid body 412 at the periphery portion of the opening. The plurality of fastening members are arranged at equal intervals around the center axis of the tank main body 410. The lid body 412 is a plate-shaped member, and the lower surface of the lid body 412 is a flat surface. The fastening member is a bolt.

Further, the lid body 412 covers the opening of the inner wall of the sub-chamber 15 of the chamber device 10. The lid body 412 is fixed to the inner wall by a plurality of fastening members (not shown) different from the fastening members being screwed into the inner wall and the lid body 412 at the periphery portion of the opening of the inner wall. Thus, the tank main body 410 and the nozzle 42 are disposed at the internal space of the chamber device 10. The plurality of fastening members are arranged at equal intervals around the center axis of the lid body 412. The fastening members are bolts.

An opening is continuously formed at the lid body 412, and a pipe (not shown) connected to the pressure adjuster 43 is inserted through the opening. The pipe extends to the internal space of the tank main body 410.

Next, the nozzle 42 of the target supply device 40 will be described. The nozzle 42 is fastened to the tank main body 410 by the fastening member 600 described later. The nozzle 42 is a second containing member which contains the target substance flowing from the tank flow path 414 of the tank main body 410, and outputs the target substance. The nozzle 42 includes a nozzle flow path 424 which communicates with the tank flow path 414 and into which the target substance flows from the tank flow path 414, and a nozzle hole 426 which communicates with the nozzle flow path 424 and outputs the target substance flowing from the nozzle flow path 424. In the comparative example, the nozzle flow path 424 is a second flow path and the nozzle 42 is also a second flow path member including a second flow path.

The center axis of the nozzle flow path 424 is arranged coaxially with the center axis of the tank flow path 414. One part of the nozzle flow path 424 communicates with the tank flow path 414. The diameter of the one part of the nozzle flow path 424 is the same as that of the tank flow path 414. The remaining part of the nozzle flow path 424 is located between the one part of the nozzle flow path 424 and the nozzle hole 426, and communicates with the one part of the nozzle flow path 424 and the nozzle hole 426. The diameter of the remaining part of the nozzle flow path 424 gradually decreases from the one part of the nozzle flow path 424 toward the nozzle hole 426. Thus, the maximum diameter of the remaining part is the same as the diameter of the one part, and the minimum diameter of the remaining part is the same as the diameter of the nozzle hole 426.

The nozzle hole 426 outputs the target substance flowing from the tank 41 through the tank flow path 414 and the nozzle flow path 424 toward the plasma generation region AR. The diameter of the nozzle hole 426 is, for example, 3 μm to 6 μm.

In the tank main body 410 and the nozzle 42, the tank main body 410 includes the planar bottom surface 410a, and the nozzle 42 includes a planar upper surface 42a which is in contact with the bottom surface 410a. In the comparative example, the bottom surface 410a is a first surface of the first containing member which is the tank main body 410, and the upper surface 42a is a second surface of the second containing member which is the nozzle 42. An opening continues to the upper surface 42a, and the opening communicates with the nozzle flow path 424. Further, an opening different from the opening of the upper surface 42a continues to the bottom surface 410a, and the opening of the bottom surface 410a communicates with the opening of the upper surface 42a and the nozzle flow path 424. This communication allows the target substance to flow from the tank main body 410 to the nozzle 42.

In the tank main body 410 and the nozzle 42 which contain the target substance and through which the target substance flows, material of each of the tank main body 410 and the nozzle 42 has low reactivity with tin as the target substance. Examples of the material include tungsten (W), molybdenum (Mo), and tantalum (Ta). The material of the lid body 412 is also the same as that of the tank main body 410. The material of each of the nozzle 42 and the lid body 412 is preferably the same as that of the tank main body 410, but may be different from the material of the tank main body 410 as long as the material is one described above having low reactivity with tin.

The target supply device 40 further includes a ring-shaped sealing member 500. In the comparative example, the sealing member 500 is a member separate from the tank main body 410 which is the first containing member and the nozzle 42 which is the second containing member as being independent from the tank main body 410 and the nozzle 42. In the comparative example, the material of the sealing member 500 is different from the material of each of the tank 41 and the nozzle 42. The sealing member 500 is made of metal, and the outer surface of the metal is plated with silver. The metal is made of stainless steel such as SUS having elasticity.

The sealing member 500 is disposed in a ring-shaped groove 428 continuous with the upper surface 42a of the nozzle 42. The groove 428 is spaced apart from the nozzle flow path 424 in the radial direction of the nozzle flow path 424. An outer wall surface and an inner wall surface of the groove 428 are located on the circumferences of circles centered on the center axis of the nozzle flow path 424, and surround the entire circumference of the nozzle flow path 424. Therefore, the sealing member 500 is disposed on the circumference of a circle centered on the center axis of the tank flow path 414 and the center axis of the nozzle flow path 424 to surround the entire circumference of the communication portion between the tank flow path 414 and the nozzle flow path 424.

The width of the cross section of the thick portion of the sealing member 500 in a plane passing through the center axis of the sealing member 500 and the radial direction of the sealing member 500 is smaller than the width of the groove 428, and the height of the cross section thereof is larger than the depth of the groove 428. Therefore, in a state where the tank main body 410 and the nozzle 42 are not fastened to each other by the fastening member 600 described later, a part of the sealing member 500 disposed in the groove 428 protrudes upward from the groove 428. When the tank main body 410 and the nozzle 42 are fastened to each other by the fastening member 600 so that the bottom surface 410a and the upper surface 42a are brought into contact with each other, the sealing member 500 is deformed to be crushed by pressing force from the bottom surface 410a. The sealing member 500 is deformed to be in close contact with the bottom surface 410a and the inner surface of the groove 428 and to fill the gap between the tank main body 410 and the nozzle 42, thereby providing sealing between the bottom surface 410a and the upper surface 42a around the communication portion between the tank flow path 414 and the nozzle flow path 424. As described above, since the sealing member 500 is made of the metal having silver plating applied to the outer surface thereof, the silver plating is deformed by the pressing force causing the bottom surface 410a and the groove 428 to be in close contact with each other to fill minute irregularities formed on the inner surfaces thereof. The irregularities are formed through processing of the tank main body 410 and the groove 428 by cutting or the like.

The target supply device 40 further includes a plurality of the fastening members 600 such as bolts for fastening the nozzle 42 and the tank main body 410 to each other so that the tank flow path 414 and the nozzle flow path 424 communicate with each other. Each of the fastening members 600 is disposed along the center axis direction of the sealing member 500, and is disposed at the outer side of the sealing member 500 in the radial direction of the sealing member 500. The plurality of fastening members 600 are arranged at equal intervals around the center axis of the nozzle flow path 424. The plurality of fastening members 600 press the nozzle 42 toward the tank main body 410 to fasten the nozzle 42 and the tank main body 410 to each other. As a result, the upper surface 42a is brought into contact with the bottom surface 410a, and as described above, the sealing member 500 provides sealing between the bottom surface 410a and the upper surface 42a around the communication portion between the tank flow path 414 and the nozzle flow path 424. Although an example in which the plurality of fastening members 600 are disposed is shown, it is only required that at least one fastening member 600 may be disposed.

The thermal expansion coefficient of the fastening member 600 is the same as that of each of the tank main body 410 and the nozzle 42.

3.2 Operation

Next, operation of the EUV light generation apparatus 100 of the comparative example will be described. In the EUV light generation apparatus 100, for example, at the time of new installation or maintenance or the like, atmospheric air in the internal space of the chamber device 10 is exhausted. At this time, purging and exhausting of the internal space of the chamber device 10 may be repeated for exhausting atmospheric components. For example, inert gas such as nitrogen or argon is preferably used for the purge gas. Thereafter, when the pressure in the internal space of the chamber device 10 becomes equal to or less than a predetermined pressure, the processor 120 starts introduction of the etching gas from the gas supply device 74 to the internal space of the chamber device 10 through the central gas supply unit 81. At this time, the processor 120 may control a supply gas flow rate adjusting unit (not shown) and the exhaust pump 60 so that the pressure in the internal space of the chamber device 10 is maintained at a predetermined pressure. Thereafter, the processor 120 waits until a predetermined time elapses from the start of introduction of the etching gas.

Further, the processor 120 causes the gas in the internal space of the chamber device 10 to be exhausted from the exhaust port 10E by the exhaust pump 60, and keeps the pressure in the internal space of the chamber device 10 substantially constant based on the signal of the pressure in the internal space of the chamber device 10 measured by the pressure sensor 26.

In order to heat and maintain the target substance in the tank 41 at a predetermined temperature equal to or higher than the melting point, the processor 120 causes the heater power source 46 to apply current to the heater 44 to increase the temperature of the heater 44. In this case, the processor 120 controls the temperature of the target substance to the predetermined temperature by adjusting a value of the current applied from the heater power source 46 to the heater 44 based on an output from the temperature sensor 45. When the target substance is tin, the predetermined temperature is equal to or higher than 232° C. being the melting point of tin, for example, 240° C. to 290° C.

Further, the processor 120 causes the pressure adjuster 43 to adjust the pressure in the tank 41 so that the melted target substance is output through the nozzle hole 426 of the nozzle 42 at a predetermined speed. Under this pressure, the target substance is output through the nozzle hole 426 of the nozzle 42. The target substance output through the nozzle hole 426 of the nozzle 42 may be in the form of jet. At this time, the processor 120 causes the piezoelectric power source 48 to apply a voltage having a predetermined waveform to the piezoelectric element 47 to generate the droplet DL. Vibration of the piezoelectric element 47 can propagate through the nozzle 42 to the target substance to be output through the nozzle hole 426 of the nozzle 42. The target substance is divided at a predetermined cycle by the vibration to be liquid droplets DL.

The target sensor 27 detects passage timing of the droplet DL passing through a predetermined position in the chamber device 10. The processor 120 outputs, to the laser device LD, a light emission trigger signal synchronized with the signal from the target sensor 27. When the light emission trigger signal is input, the laser device LD emits the pulsed laser light 90. The emitted laser light 90 is incident on the laser light concentrating optical system 13 through the laser light delivery optical system 30 and the window 12. Further, the laser light 90 travels from the laser light concentrating optical system 13 to the central gas supply unit 81 which is an emission portion. The laser light 90 is emitted along the focal line L0 toward the plasma generation region AR from the central gas supply port 81a, which is the emission port of the central gas supply unit 81, and is radiated to the droplet DL in the plasma generation region AR. At this time, the processor 120 controls the laser light manipulator 13C of the laser light concentrating optical system 13 such that the laser light 90 is concentrated in the plasma generation region AR. The processor 120 controls the timing of emitting the laser light 90 from the laser device LD based on the signal from the target sensor 27 so that the droplet DL is irradiated with the laser light 90. Thus, the droplet DL is irradiated in the plasma generation region AR with the laser light 90 concentrated by the laser light concentrating mirror 13A. Light including EUV light is emitted from the plasma generated through the irradiation.

Among the light including the EUV light generated in the plasma generation region AR, the EUV light 101 is concentrated at the intermediate focal point IF by the EUV light concentrating mirror 75, and then is incident on the exposure apparatus 200 from the connection portion 19. Therefore, it can be understood that the connection portion 19 is the emission port of the EUV light 101 in the EUV light generation apparatus 100.

When the target substance is turned into plasma, tin fine particles are generated as described above. The fine particles diffuse into the internal space of the chamber device 10. The fine particles diffusing into the internal space of the chamber device 10 react with the hydrogen-containing etching gas supplied from the central gas supply unit 81 to become stannane. Most of the stannane obtained through the reaction with the etching gas flows into the exhaust port 10E along with the flow of the unreacted etching gas. At least some of the unreacted charged particles, fine particles, and etching gas flow into the exhaust port 10E.

The unreacted etching gas, fine particles, charged particles, stannane, and the like having flowed into the exhaust port 10E flow as residual gas through the exhaust pipe 10P into the exhaust pump 60 and are subjected to predetermined exhaust treatment such as detoxification.

3.3 Problem

When the pressure in the tank 41 becomes higher than a predetermined value, tin as the target substance may leak from the communication portion between the tank flow path 414 and the nozzle flow path 424 toward the sealing member 500 through a minute gap between the bottom surface 410a and the upper surface 42a, and may be brought into contact with the sealing member 500. The material of the sealing member 500 is different from the material of each of the tank main body 410 and the nozzle 42. In this case, the sealing member 500 in contact with the target substance may have higher reactivity with the target substance than the tank main body 410 and the nozzle 42, and may be eroded and corroded by the target substance earlier than the tank main body 410 and the nozzle 42. Due to the erosion and corrosion, the sealing member 500 deteriorates earlier than the tank main body 410 and the nozzle 42, and close contact of the sealing member 500 to the tank main body 410 and the nozzle 42 is weakened. When the close contact is weakened, a gap is generated between the sealing member 500 and each of the tank main body 410 and the nozzle 42, and there is concern that the target substance may leak through the gap to the outside of the target supply device 40. Therefore, there is concern that a usable period of the target supply device 40 may become shorter than an estimated period estimated in advance.

Therefore, in the following embodiment, the target supply device 40 capable of suppressing the usable period from becoming shorter than the estimated period is exemplified.

4. Description of Target Supply Device of First Embodiment

Figure 4:
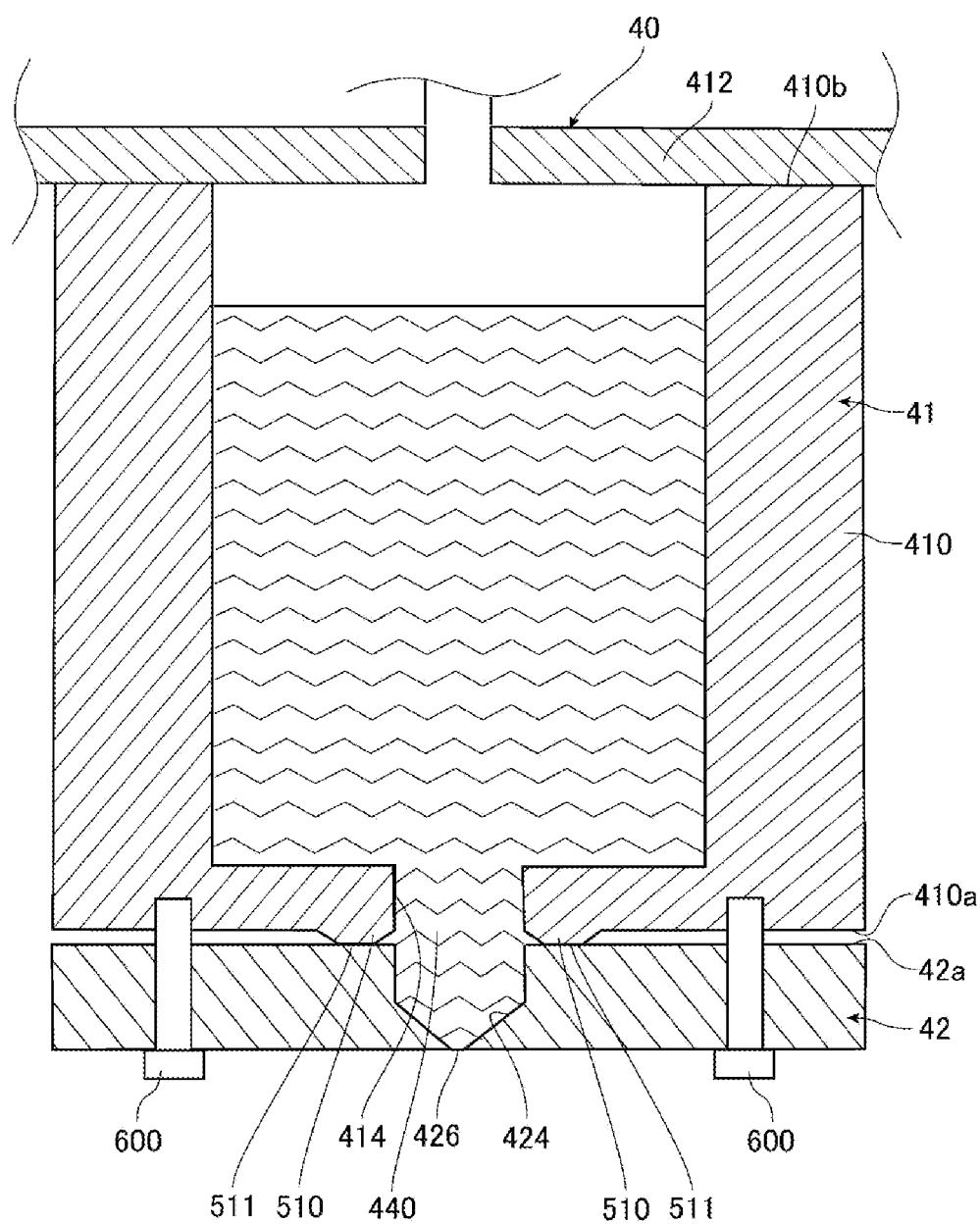
FIG. 4 is a schematic view showing an exemplary schematic configuration of a part including a target supply device of a first embodiment.

Next, a configuration of the target supply device 40 of the first embodiment will be described. Any component same as that described above is denoted by an identical reference sign, and duplicate description thereof is omitted unless specific description is needed.
4.1 Configuration FIG. 4 is a schematic view showing an exemplary schematic configuration of a part including the target supply device 40 of the present embodiment. In FIG. 4, similarly to FIG. 3, some of the configuration of the target supply device 40, such as the pressure adjuster 43, the heater 44, and the temperature sensor 45, is omitted.

In the target supply device 40 of the present embodiment, similarly to the target supply device 40 of the comparative example, the first containing member and the first flow path member are the tank main body 410, the first flow path is the tank flow path 414, the second containing member and the second flow path member are the nozzle 42, and the second flow path is the nozzle flow path 424. In addition, in the target supply device 40 of the present embodiment, similarly to the target supply device 40 of the comparative example, the first surface of the first containing member is the bottom surface 410a of the tank main body 410, and the second surface of the second containing member is the upper surface 42a of the nozzle 42.

The configuration of the nozzle 42 of the present embodiment is the same as that of the nozzle 42 of the comparative example except that the groove 428 is omitted.

The configuration of the tank main body 410 of the present embodiment is the same as that of the tank main body 410 of the comparative example except that the sealing member 500 is a part of the tank main body 410. Since a part of the tank main body 410 has the function of the sealing member 500, a portion of the tank main body 410 corresponding to the sealing member 500 of the comparative example will be described below as a sealing portion 510.

The sealing portion 510 is configured as a part of the tank main body 410 by processing such as cutting of the tank main body 410, and is formed integrally with the tank main body 410. Thus, the sealing portion 510 is not a member separate from the tank main body 410 nor a member integrated with the tank main body 410 by joining or the like.

Since the sealing portion 510 is configured as a part of the tank main body 410 as described above, the material of the sealing portion 510 is the same as that of the tank main body 410. Such a material is the same as that in the comparative example. The thermal expansion coefficient of the sealing portion 510 is also the same as that of the tank main body 410.

The sealing portion 510 is formed in a ring shape by cutting or the like of the bottom surface 410a, and is continuous with the bottom surface 410a. The sealing portion 510 is a protrusion extending from the bottom surface 410a of the tank main body 410 toward the upper surface 42a of the nozzle 42.

The sealing portion 510 includes a close-contact surface 511 which is brought into close contact with the upper surface 42a by fastening with the fastening member 600. The close-contact surface 511 is a ring-shaped flat surface. The upper surface 42a of the present embodiment is a flat surface similarly to the upper surface 42a of the comparative example. Regarding the upper surface 42a of the present embodiment, only the region being in close contact with the close-contact surface 511 on the upper surface 42a may be a flat surface in close contact with the close-contact surface 511. The area of the close-contact surface 511 is smaller than the area of the entire bottom surface 410a excluding the sealing portion 510.

Since the sealing portion 510 is a protrusion as described above, the close-contact surface 511 is located closer to the upper surface 42a than the planar bottom surface 410a excluding the sealing portion 510. Therefore, the bottom surface 410a excluding the sealing portion 510 is spaced apart from the upper surface 42a more than the close-contact surface 511, and a gap is formed between the bottom surface 410a excluding the sealing portion 510 and the upper surface 42a. In addition, only the close-contact surface 511 is in close contact with the upper surface 42a, and the bottom surface 410a excluding the sealing portion 510 is not in contact with the upper surface 42a, and is disposed away from the upper surface 42a facing the upper surface 42a.

The surface roughness Ry of the close-contact surface 511 is, for example, 0.2 µm to 1.6 µm. The ratio of the height of the sealing portion 510 to the width of the close-contact surface 511 in the radial direction of the sealing portion 510 is, for example, 1:6. In FIG. 4, the height and the width are not shown in accordance with the ratio. The entire surface roughness Ry of the upper surface 42a of the nozzle 42 with which the close-contact surface 511 is in close contact is, for example, 0.2 µm to 1.6 µm. The surface roughness Ry may be, for example, 0.2 µm to 1.6 µm only in the region of the upper surface 42a of the nozzle 42 where the close-contact surface 511 is in close contact.

The ring-shaped sealing portion 510 is located on the circumference of a circle centered on the center axis of the communication portion 440 between the tank flow path 414 and the nozzle flow path 424, and surrounds the entire circumference of the communication portion 440. The inner peripheral surface of the sealing portion 510 is continuous with the inner peripheral surface of the tank main body 410 at the tank flow path 414. Therefore, the inner peripheral surface of the sealing portion 510 is continuous with the edge of the inner peripheral surface of the tank flow path 414, and the bottom surface 410a is not located between the inner peripheral surface of the sealing portion 510 and the inner peripheral surface of the tank main body 410 at the tank flow path 414.

A cross section of the sealing portion 510 in a plane including the center axis of the sealing portion 510 has a trapezoidal shape.

One side surface of the trapezoidal cross section is an outer peripheral surface of the sealing portion 510. This one side surface is a tapered surface inclined with respect to the center axis direction of the sealing portion 510, and is located to gradually approach the center axis of the sealing portion 510 from the bottom surface 410a toward the upper surface 42a. Therefore, the outer diameter of the sealing portion 510 gradually decreases from the bottom surface 410a toward the upper surface 42a in the center axis direction of the sealing portion 510. The inclination angle of the one side surface with respect to the bottom surface 410a is, for example, 30°.

The other side surface of the trapezoidal cross section is the inner peripheral surface of the sealing portion 510. This side surface is a tapered surface inclined to the side opposite to the one side surface with respect to the center axis direction of the sealing portion 510, and is located gradually away from the center axis of the sealing portion 510 from the bottom surface 410a toward the upper surface 42a. Therefore, the inner diameter of the sealing portion 510 gradually increases from the bottom surface 410a toward the upper surface 42a in the center axis direction of the sealing portion 510. The inclination angle of the other side surface with respect to the bottom surface 410a is, for example, 30°.

In this manner, the width of the cross section in the radial direction of the sealing portion 510 gradually decreases from the bottom surface 410a toward the upper surface 42a.

The sealing portion 510 is located between the communication portion 440 and the fastening member 600 in the radial direction of the sealing portion 510.

The fastening member 600 fastens the tank main body 410 and the nozzle 42 to each other so that the tank flow path 414 communicates with the nozzle flow path 424 through the communication portion 440. The fastening member 600 presses the upper surface 42a against the sealing portion 510 by fastening.

The sealing portion 510 is plastically deformed by being pressed against the upper surface 42a by the fastening member 600. The sealing portion 510 seals the gap between the bottom surface 410a and the upper surface 42a around the communication portion 440 due to the plastic deformation. Here, surface pressure at the close-contact surface 511 of the sealing portion 510 in close contact with the upper surface 42a is defined as P, internal pressure in the gap sealed by the sealing portion 510 is defined as Pi, and the safety coefficient is defined as a. For example, the internal pressure Pi is 40 MPa and the safety factor has a value of 0.2 to 2. The surface pressure P is calculated from the following equation.

$$P=Pi(1+\alpha)$$

4.2 Effect

In the target supply device 40 of the present embodiment, the first containing member is the tank main body 410, and the second containing member is the nozzle 42. The sealing portion 510 is formed integrally with the tank main body 410, extends from the bottom surface 410a toward the upper surface 42a, and is in close contact with the upper surface 42a. The fastening member 600 presses the sealing portion 510 against the upper surface 42a. The sealing portion 510 is plastically deformed by being pressed against the upper surface 42a by the fastening member 600, and seals the gap between the bottom surface 410a and the upper surface 42a around the communication portion 440 by the plastic deformation.

Since the sealing portion 510 is formed integrally with the tank main body 410, the material of the sealing portion 510 is the same as that of the tank main body 410. Therefore, even when tin as the target substance is brought into contact with the sealing portion 510, the sealing portion 510 can be prevented from having higher reactivity with the target substance than the tank main body 410, and can be prevented from being eroded and corroded by the target substance earlier than the tank main body 410. When the erosion and corrosion of the sealing portion 510 earlier than the tank main body 410 are suppressed, deterioration of the sealing portion 510 earlier than the tank main body 410 can be suppressed. The sealing portion 510, deterioration of which is suppressed, is plastically deformed by being pressed against the upper surface 42a by the fastening member 600, and is brought into close contact with the upper surface 42a by the plastic deformation. When the nozzle 42 is processed by cutting or the like, minute irregularities are formed on the upper surface 42a by the processing. The close-contact surface 511 is plastically deformed and is brought into close contact to fill the irregularities. When the sealing portion 510 is in close contact, as compared with when the close contact is weakened due to deterioration, the sealing portion 510 can suppress generation of a gap between the sealing portion 510 and the upper surface 42a of the nozzle 42 and leakage of the target substance through the gap can be suppressed. Therefore, in the target supply device 40 of the present embodiment, the usable period of the target supply device 40 can be suppressed from becoming shorter than the estimated period.

Further, in the target supply device 40 of the present embodiment, the sealing portion 510 is a part of the tank main body 410. Therefore, as compared with the comparative example in which the sealing member 500 is a member separate from the tank main body 410, the number of components of the target supply device 40 can be reduced, the contact interface between the sealing portion 510 and the tank main body 410 can be reduced, generation of a gap between the sealing portion 510 and the bottom surface 410a of the tank main body 410 can be suppressed, and leakage of the target substance through the gap can be suppressed.

In the case where the sealing member 500 is a member separate from the tank main body 410 as in the comparative example, when the internal pressure in the gap sealed by the sealing member 500 becomes higher than expected, the sealing member 500 extends in the radial direction of the sealing member 500, and the contact portion of the sealing member 500 with the bottom surface 410a and the upper surface 42a is worn due to the extension, and the contact portion may deteriorate due to wear. However, in the target supply device 40 of the present embodiment, the sealing portion 510 is integrally formed with the tank main body 410. Therefore, compared to the case where the sealing member 500 is a member separate from the tank main body 410 as in the comparative example, extension of the sealing portion 510 is suppressed, and deterioration of the sealing portion 510 due to wear of the contact portion with the bottom surface 410a and the upper surface 42a can be suppressed.

In the target supply device 40 of the present embodiment, the surface pressure P is calculated from the above equation.

The surface pressure P calculated from the expression defines the amount of plastic deformation of the sealing portion 510 in the center axis direction of the sealing portion 510. Accordingly, damage to the sealing portion 510 due to excessive pressing by the fastening member 600 can be suppressed.

In the target supply device 40 of the present embodiment, the outer diameter of the sealing portion 510 gradually decreases from the tank main body 410 toward the nozzle 42. The inner diameter of the sealing portion 510 gradually increases from the tank main body 410 toward the nozzle 42 in the direction of the center axis of the sealing portion 510, contrary to the outer diameter.

Accordingly, the cross section of the sealing portion 510 may be trapezoidal, and the width of the cross section in the radial direction of the sealing portion 510 may gradually decrease from the tank main body 410 toward the nozzle 42. In this case, when the sealing portion 510 is pressed by the fastening member 600, stress concentration at an edge portion of the sealing portion 510 can be alleviated as compared with the case where the sealing portion 510 has a rectangular cross section. The edge portion indicates an edge portion between the close-contact surface 511 and the outer peripheral surface of the sealing portion 510 and an edge portion between the close-contact surface 511 and the inner peripheral surface of the sealing portion 510. When the stress concentration is relaxed, damage of the sealing portion 510 due to the stress concentration can be suppressed. The outer diameter of the sealing portion 510 may gradually increase from the tank main body 410 toward the nozzle 42, and the inner diameter of the sealing portion 510 may gradually decrease from the tank main body 410 toward the nozzle 42.

Further, in the target supply device 40 of the present embodiment, the inner peripheral surface of the sealing portion 510 is continuous with the inner peripheral surface of the tank main body 410 at the tank flow path 414 of the tank main body 410.

In this case, as compared with the case where the inner peripheral surface of the sealing portion 510 is not continuous with the inner peripheral surface of the tank main body 410, the processing surface and the processing number of the tank main body 410 at the time of forming the sealing portion 510 to the tank main body 410 can be reduced. The inner peripheral surface of the sealing portion 510 does not necessarily need to be continuous with the inner peripheral surface of the tank main body 410. Therefore, the minimum inner diameter of the sealing portion 510 does not need to be the same as the inner diameter of the tank main body 410 at the tank flow path 414, and may be larger than the inner diameter of the tank main body 410.

In the target supply device 40 of the present embodiment, the bottom surface 410a with which the sealing portion 510 is continuous is a flat surface, and is spaced apart from the upper surface 42a more than the close-contact surface 511 of the sealing portion 510.

Therefore, in the tank main body 410, close contact of the bottom surface 410a excluding the close-contact surface 511 to the upper surface 42a is suppressed, and close contact of the close-contact surface 511 to the upper surface 42a can be visually confirmed from the side of the sealing portion 510. Further, as compared with the case where the bottom surface 410a is not spaced apart and the bottom surface 410a is also in close contact with the upper surface 42a as the close-contact surface, the pressing force of the fastening member 600 is easily concentrated on the close-contact surface 511, the close-contact surface 511 is easily plastically deformed, and sealing can be ensured.

In the target supply device 40 of the present embodiment, the close-contact surface 511 of the sealing portion 510 and the upper surface 42a are flat surfaces.

In this case, compared to a case where the close-contact surface 511 and the upper surface 42a are not flat surfaces, the close-contact surface 511 is easily plastically deformed and can be easily brought into close contact with the upper surface 42a. Here, the close-contact surface 511 and the upper surface 42a are not necessarily flat surfaces.

In the target supply device 40 of the present embodiment, the thermal expansion coefficients of the tank main body 410, the nozzle 42, and the fastening member 600 are the same as each other. Further, since the sealing portion 510 is a part of the tank main body 410, the thermal expansion coefficient of the sealing portion 510 is the same as that of the tank main body 410. When the thermal expansion coefficient of the fastening member 600 is different from the thermal expansion coefficient of each of the tank main body 410 and the nozzle 42, loosening of fastening or shearing of the fastening member 600 may be caused. However, since the thermal expansion coefficients are the same as each other, loosening of the fastening or shearing of the fastening member 600 can be suppressed.

Further, in the target supply device 40 of the present embodiment, the fastening member 600 is disposed at the outer side of the sealing portion 510 in the radial direction of the sealing portion 510.

In this case, contact of the target substance with the fastening member 600 may be suppressed by the sealing portion 510, erosion and corrosion of the fastening member 600 due to the contact may be suppressed, and deterioration of the fastening member 600 due to the erosion and corrosion may be suppressed. Further, the sealing portion 510 can suppress the internal pressure in the gap sealed by the sealing portion 510 from being applied to the fastening member 600, and occurrence of shearing at the fastening member 600 due to the internal pressure can be suppressed.

Further, in the target supply device 40 of the present embodiment, the sealing portion 510 is a part of the tank main body 410 formed by processing the tank main body 410.

Thus, the sealing portion 510 is not a member separate from the tank main body 410 nor a member integrated with the tank main body 410 by joining or the like. When the sealing portion 510 is integrated with the tank main body 410 by joining or the like, and an internal pressure equal to or higher than a predetermined pressure in the gap sealed by the sealing portion 510 is applied to the sealing portion 510, the joining is released by the internal pressure, and the sealing portion 510 is displaced from the tank main body 410 compared to before the release of the joining, and there is concern that the sealing is not secured. However, since the sealing portion 510 of the present embodiment is formed by processing the tank main body 410, compared to the above, even when the internal pressure is applied to the sealing portion 510, the displacement of the sealing member 500 from the tank main body 410 can be suppressed, and sealing can be secured.

5. Description of Target Supply Device of Second Embodiment

Next, a configuration of the target supply device 40 of a second embodiment will be described. Any component same as that described above is denoted by an identical reference sign, and duplicate description thereof is omitted unless specific description is needed.

5.1 Configuration

Figure 5:
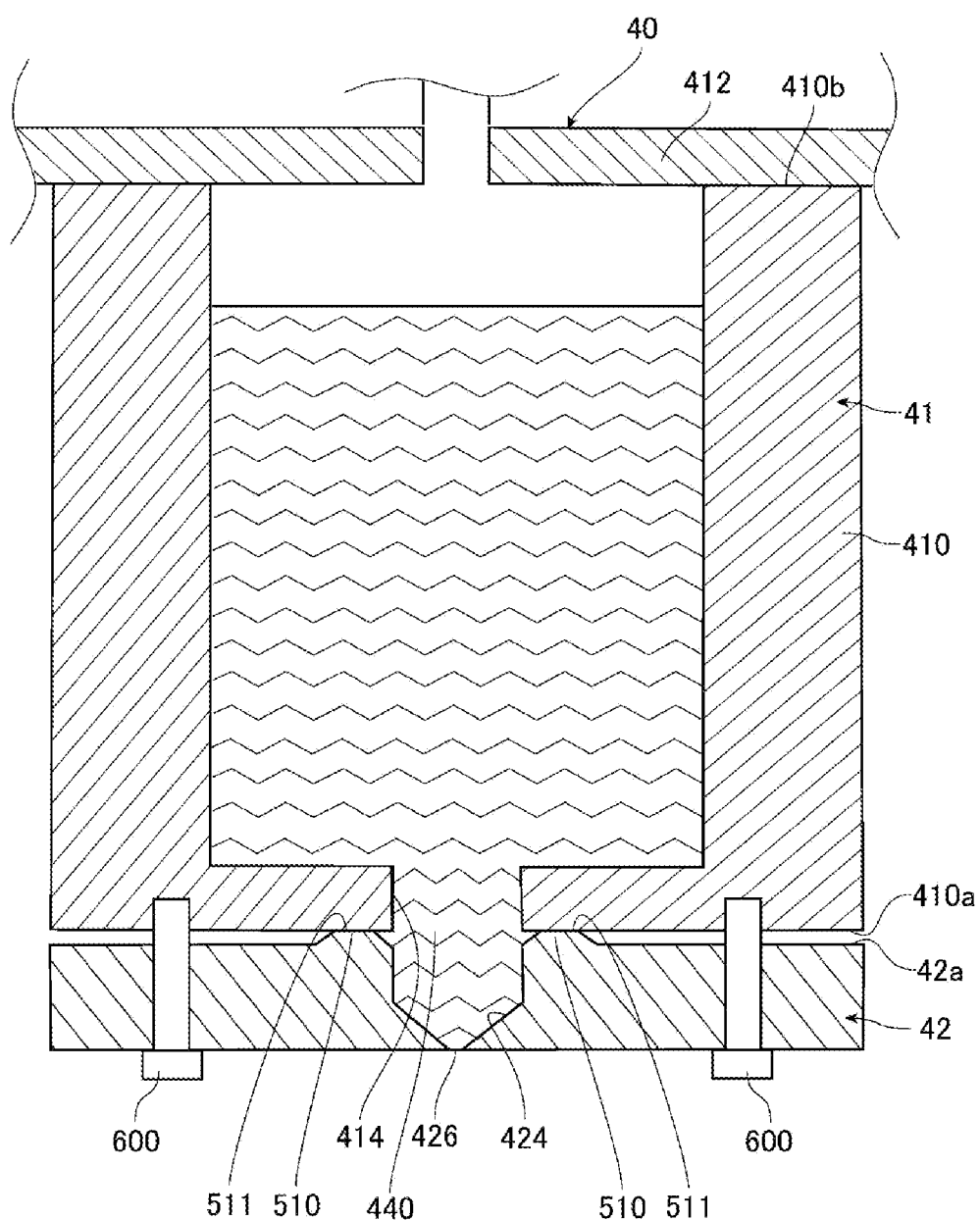
FIG. 5 is a schematic view showing an exemplary schematic configuration of a part including a target supply device of a second embodiment.

FIG. 5 is a schematic view showing an exemplary schematic configuration of a part including the target supply device 40 of the present embodiment. In FIG. 5, similarly to FIG. 3, some of the configuration of the target supply device 40, such as the pressure adjuster 43, the heater 44, and the temperature sensor 45, is omitted.

In the target supply device 40 of the present embodiment, similarly to the target supply device 40 of the first embodiment, the first containing member and the first flow path member are the tank main body 410, the first flow path is the tank flow path 414, the second containing member and the second flow path member are the nozzle 42, and the second flow path is the nozzle flow path 424. In addition, in the target supply device 40 of the present embodiment, similarly to the target supply device 40 of the comparative example, the first surface of the first containing member is the bottom surface 410a of the tank main body 410, and the second surface of the second containing member is the upper surface 42a of the nozzle 42.

The configuration of the tank main body 410 of the present embodiment is the same as that of the comparative example, that is, the same as that of the tank main body 410 of the first embodiment except that the sealing portion 510 is omitted.

The configuration of the nozzle 42 of the present embodiment is the same as that of the first embodiment except that the sealing portion 510 is a part of the nozzle 42 and is formed integrally with the nozzle 42. As described above, in the target supply device 40 of the present embodiment, the position of the sealing portion 510 is different from that of the first embodiment.

As the configuration of the target supply device 40 of the present embodiment, the relationship between the nozzle 42 and the sealing portion 510 which is a part of the nozzle 42 in the present embodiment is the same as that between the tank main body 410 and the sealing portion 510 which is a part of the tank main body 410 in the first embodiment.

The sealing portion 510 of the present embodiment is inverted up and down from the sealing portion 510 of the first embodiment. Accordingly, the outer diameter of the sealing portion 510 gradually increases from the bottom surface 410a toward the upper surface 42a, and the inner diameter of the sealing portion 510 gradually decreases from the bottom surface 410a toward the upper surface 42a. In this manner, the width of the cross section of the sealing portion 510 in the radial direction is gradually increased from the bottom surface 410a toward the upper surface 42a.

The fastening member 600 of the present embodiment presses the sealing portion 510 against the bottom surface 410a by fastening, and the sealing portion 510 is plastically deformed by being pressed against the bottom surface 410a by the fastening member 600.

The relationship between the sealing portion 510 and the tank main body 410 pressed against the sealing portion 510 in the present embodiment is the same as that between the sealing portion 510 and the nozzle 42 pressed against the sealing portion 510 in the first embodiment.

5.2 Effect

In the target supply device 40 of the present embodiment, the first containing member is the tank main body 410, and the second containing member is the nozzle 42. The sealing portion 510 is formed integrally with the nozzle 42, extends from the upper surface 42a toward the bottom surface 410a, and is in close contact with the bottom surface 410a. The fastening member 600 presses the sealing portion 510 against the bottom surface 410a. The sealing portion 510 is plastically deformed by being pressed against the bottom surface 410a by the fastening member 600, and seals the gap between the bottom surface 410a and the upper surface 42a around the communication portion 440 by the plastic deformation.

As described above, the relationship between the sealing portion 510 and the tank main body 410 pressed against the sealing portion 510 in the present embodiment is the same as that between the sealing portion 510 and the nozzle 42 pressed against the sealing portion 510 in the first embodiment. Therefore, the operation and effect obtained by the relationship between the sealing portion 510 and the tank main body 410 in the present embodiment are the same as those obtained by the relationship between the sealing portion 510 and the nozzle 42 in the first embodiment. The relationship between the nozzle 42 and the sealing portion 510 formed integrally with the nozzle 42 in the present embodiment is the same as that between the tank main body 410 and the sealing portion 510 formed integrally with the tank main body 410 in the first embodiment. Therefore, the operation and effect obtained by the relationship between the nozzle 42 and the sealing portion 510 in the present embodiment are the same as those obtained by the relationship between the tank main body 410 and the sealing portion 510 in the first embodiment. As described above, in the target supply device 40 of the present embodiment, even when the sealing portion 510 is formed integrally with the nozzle 42, it is possible to obtain the same operation and effect as in the case where the sealing portion 510 is formed integrally with the tank main body 410 as shown in the first embodiment.

6. Description of Target Supply Device of Third Embodiment

Next, a configuration of the target supply device 40 of a third embodiment will be described. Any component same as that described above is denoted by an identical reference sign, and duplicate description thereof is omitted unless specific description is needed.

6.1 Configuration

Figure 6:
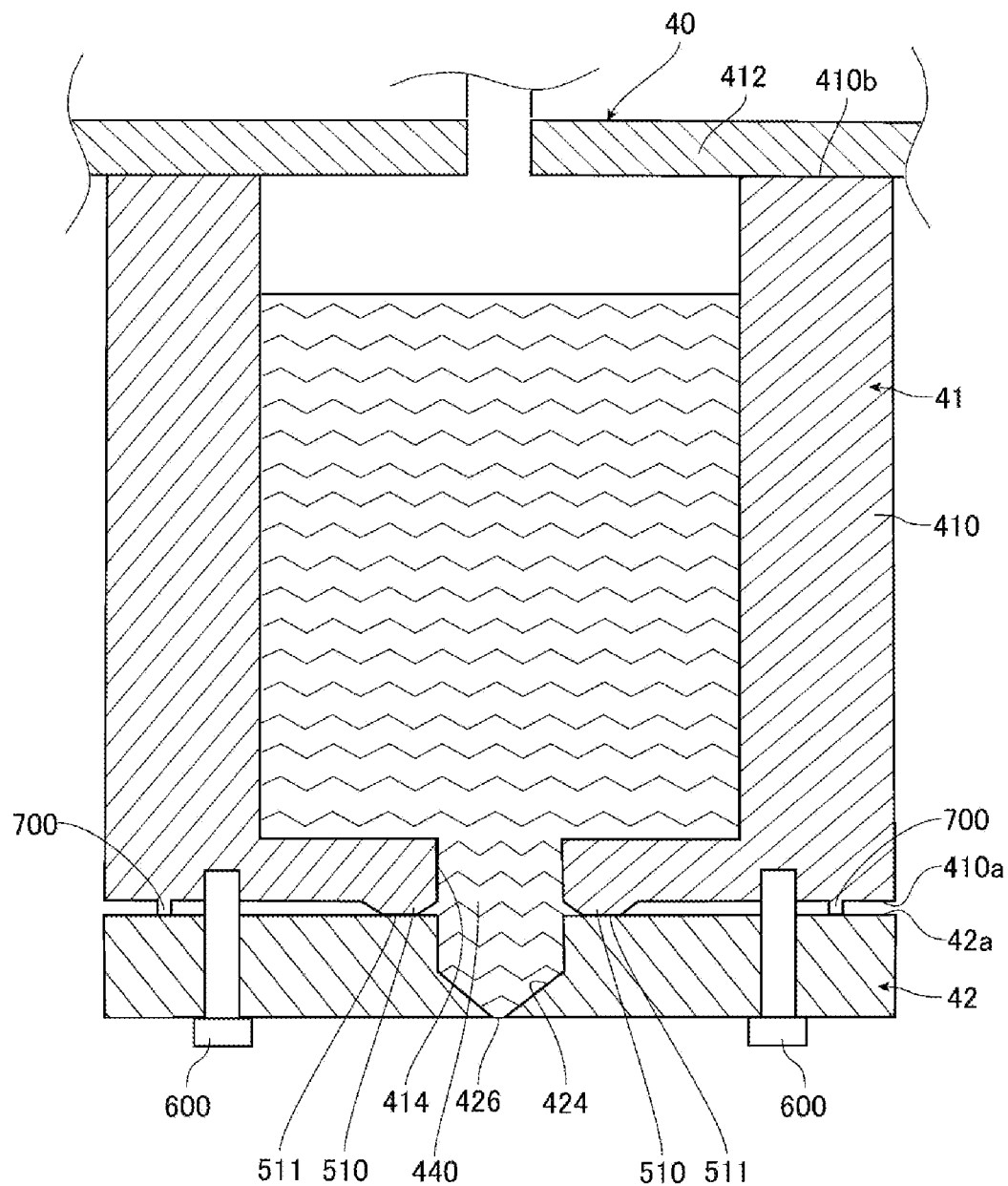
FIG. 6 is a schematic view showing an exemplary schematic configuration of a part including a target supply device of a third embodiment.

FIG. 6 is a schematic view showing an exemplary schematic configuration of a part including the target supply device 40 of the present embodiment. In FIG. 6, similarly to FIG. 3, some of the configuration of the target supply device 40, such as the pressure adjuster 43, the heater 44, and the temperature sensor 45, is omitted.

In the target supply device 40 of the present embodiment, similarly to the target supply device 40 of the first embodiment, the first containing member and the first flow path member are the tank main body 410, the first flow path is the tank flow path 414, the second containing member and the second flow path member are the nozzle 42, and the second flow path is the nozzle flow path 424. In addition, in the target supply device 40 of the present embodiment, similarly to the target supply device 40 of the comparative example, the first surface of the first containing member is the bottom surface 410a of the tank main body 410, and the second surface of the second containing member is the upper surface 42a of the nozzle 42.

In the target supply device 40 of the present embodiment, the configuration of the nozzle 42 is the same as that of the first embodiment, but the configuration of the tank main body 410 is different from that of the first embodiment. Specifically, the tank main body 410 of the present embodiment further includes an extending portion 700 which is a part of the tank main body 410 of the first embodiment.

Similarly to the sealing portion 510, the extending portion 700 is configured as a part of the tank main body 410 by processing such as cutting of the tank main body 410, and is formed integrally with the tank main body 410. Therefore, the extending portion 700 is not a member separate from the tank main body 410 or a member integrated with the tank main body 410 by joining or the like.

Since the extending portion 700 is configured as a part of the tank main body 410 as described above, the material of the extending portion 700 is the same as that of the tank main body 410. The thermal expansion coefficient of the extending portion 700 is also the same as that of the tank main body 410.

Similarly to the sealing portion 510, the extending portion 700 is formed in a ring shape by cutting or the like of the bottom surface 410a, and is continuous with the bottom surface 410a. The extending portion 700 is a protrusion extending from the bottom surface 410a of the tank main body 410 toward the upper surface 42a of the nozzle 42.

The extending portion 700 is located on the circumference of a circle centered on the center axis of the communication portion 440. The extending portion 700 is located at the outer side of the fastening member 600 in the radial direction of the sealing portion 510, and surrounds the entire circumference of the sealing portion 510 and the fastening member 600. Therefore, the fastening member 600 is disposed between the sealing portion 510 and the extending portion 700 in the radial direction of the tank flow path 414.

Figure 7:
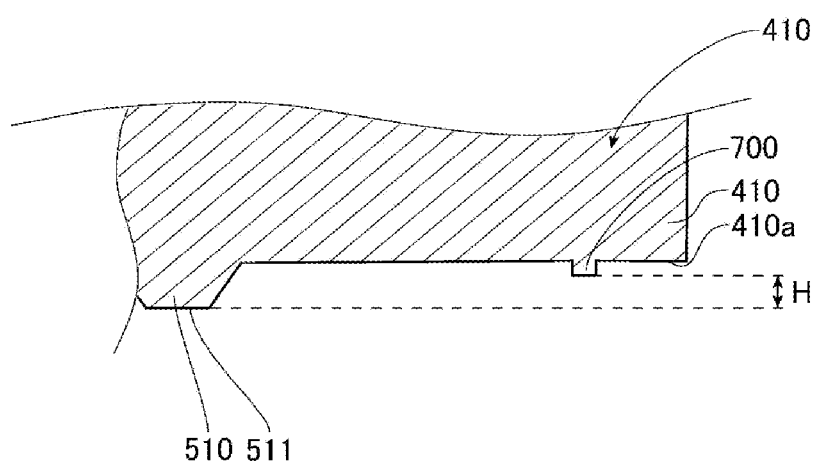
FIG. 7 is a view showing difference in height between an extending portion and a sealing portion.

The cross section of the extending portion 700 in a plane including the center axis of the extending portion 700 has a rectangular shape. Although an example in which the cross section has a square shape is shown, the shape of the cross section is not limited to a square shape or a rectangular shape. In a state where the tank main body 410 and the nozzle 42 are opposed to each other before the tank main body 410 and the nozzle 42 are fastened, the planar contact surface of the extending portion 700 is spaced apart from the upper surface 42a of the nozzle 42 more than the close-contact surface 511 of the sealing portion 510. Therefore, as shown in FIG. 7, the height of the extending portion 700 from the bottom surface 410a is smaller than the height of the sealing portion 510 from the bottom surface 410a, and the difference H in height between the extending portion 700 and the sealing portion 510 is, for example, 10 µm to 100 µm.

The fastening member 600 presses the nozzle 42 against the tank main body 410 until the extending portion 700 is brought into surface contact with the upper surface 42a after the close-contact surface 511 is brought into contact with the upper surface 42a. Therefore, the extending portion 700 is brought into surface contact with the upper surface 42a of the nozzle 42 as following the sealing portion 510 due to fastening of the tank main body 410 and the nozzle 42.

6.2 Effect

In the target supply device 40 of the present embodiment, the extending portion 700 is a part of the tank main body 410 and extends from the bottom surface 410a toward the upper surface 42a. The extending portion 700 is brought into contact with the upper surface 42a of the nozzle 42 as following the sealing portion 510 due to fastening of the tank main body 410 and the nozzle 42.

In the target supply device 40 of the present embodiment, the sealing portion 510 is plastically deformed during a period from when the close-contact surface 511 is brought into contact with the upper surface 42a to when the extending portion 700 is brought into contact with the upper surface 42a. Therefore, the amount of plastic deformation the sealing portion 510 can be defined by the difference H between the height of the sealing portion 510 and the height of the extending portion 700, and the reproducibility of the plastic deformation amount can be improved as compared with the case where the plastic deformation amount is not defined by the difference H. The extending portion 700 does not need to be in surface contact with the upper surface 42a, and the extending portion 700 may be tapered toward the upper surface 42a and the extending portion 700 may be in point contact or line contact with the upper surface 42a.

In the target supply device 40 of the present embodiment, the extending portion 700 has a ring shape, is located at the outer side of the fastening member 600 in the radial direction of the sealing portion 510, and surrounds the entire circumference of the sealing portion 510 and the fastening member 600.

In this case, as compared with the case where the extending portion 700 is disposed at the inner side of the fastening member 600, the close contact of the extending portion 700 with the upper surface 42a can be easily visually confirmed from the side of the fastening member 600. In addition, when the extending portion 700 has a ring shape, the extending portion 700 can be visually observed from any side of the fastening member 600.

In the target supply device 40, an opening or groove is preferably formed in the extending portion 700 when leakage of sealing at the sealing portion 510 is to be checked after assembling the target supply device 40. The opening penetrates the extending portion 700 in the radial direction of the extending portion 700. The groove is recessed in the center axis direction of the extending portion 700 and penetrates the extending portion 700 in the radial direction of the extending portion 700. Leakage is checked from such an opening or groove. Alternatively, the extending portion 700 need not be ring-shaped to check for leakage. For example, a plurality of the extending portions 700 may be located at equal intervals around the center axis of the tank main body 410, and leakage may be checked through gaps between the plurality of extending portions 700.

7. Description of Target Supply Device of Fourth Embodiment

Next, a configuration of the target supply device 40 of a fourth embodiment will be described. Any component same as that described above is denoted by an identical reference sign, and duplicate description thereof is omitted unless specific description is needed.

7.1 Configuration

Figure 8:
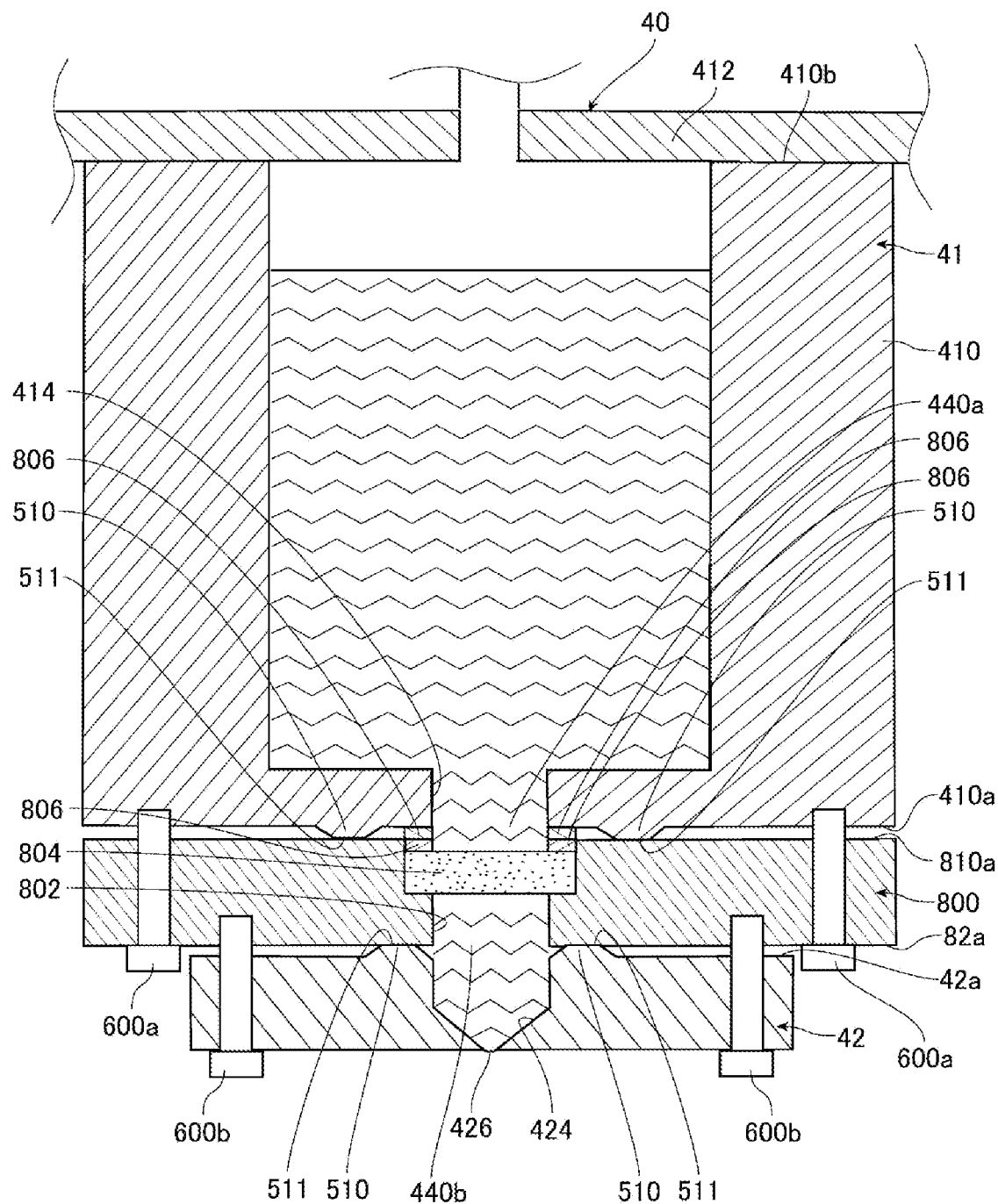
FIG. 8 is a schematic view showing an exemplary schematic configuration of a part including a target supply device of a fourth embodiment.

FIG. 8 is a schematic view showing an exemplary schematic configuration of a part including the target supply device 40 of the present embodiment. In FIG. 8, similarly to FIG. 3, some of the configuration of the target supply device 40, such as the pressure adjuster 43, the heater 44, and the temperature sensor 45, is omitted.

The target supply device 40 of the present embodiment includes the tank main body 410 of the first embodiment and the nozzle 42 of the second embodiment. Therefore, in the target supply device 40 of the present embodiment, the sealing portion 510 is formed in each of the tank main body 410 and the nozzle 42. The target supply device 40 of the present embodiment further includes a filter case 800 disposed between the tank main body 410 and the nozzle 42.

The filter case 800 is a containing member which contains the target substance, and is also a flow path member through which the target substance flows. The filter case 800 will be described below.

The filter case 800 has a cylindrical shape. The filter case 800 includes a case flow path 802 communicating with the tank flow path 414 and the nozzle flow path 424, a filter 804 disposed in the case flow path 802, and a fixing member 806 fixing the filter 804 to the filter case 800.

The case flow path 802 is a supply path through which the target substance flowing from the tank flow path 414 flows out to the nozzle flow path 424. A part of the case flow path 802 communicates with the tank flow path 414, and the diameter of the one part is larger than that of the tank flow path 414. The remaining part of the case flow path 802 communicates with the nozzle flow path 424, and the diameter of the remaining part is the same as that of the nozzle flow path 424. The diameter of the remaining part may be larger than that of the nozzle flow path 424 or may be the same as that of the one part.

The filter 804 filters the target substance passing through the filter 804 to remove particles from the target substance. The particles are metal oxides such as tin oxide. The filter 804 is formed of, for example, a porous member in order to collect particles. Accordingly, numerous through holes are formed in the filter 804, and the diameter of the through holes is, for example, 3 μm to 10 μm. Here, the difference between the thermal expansion coefficient of the filter 804 and the thermal expansion coefficient of the filter case 800 is preferably smaller than 20% of the thermal expansion coefficient of the filter case 800.

The outer peripheral surface of the filter 804 is in close contact with the inner peripheral surface of the filter case 800 at the case flow path 802, and the gap between the outer peripheral surface of the filter 804 and the inner peripheral surface of the filter case 800 is sealed.

The fixing member 806 is overlaid on the filter 804 and is caused to be in contact with the bottom surface 410a. The fixing member 806 is pressed toward the filter 804 by the bottom surface 410a when the tank main body 410 and the filter case 800 are fastened by a fastening member 600a described later. Thus, the fixing member 806 presses the filter 804 to a step formed on the inner peripheral surface of the filter case 800 at the case flow path 802, and fixes the filter 804 to the step. The step is formed between the one part and the remaining part of the case flow path 802. The fixing member 806 is a ring-shaped shim, and is disposed on the circumference of a circle centered on the center axis of the case flow path 802. The fixing member 806 is disposed at the inner side of the sealing portion 510. Therefore, the inner peripheral surface of the sealing portion 510 on the tank main body 410 side in the present embodiment is not continuous with the inner peripheral surface of the tank main body 410 at the tank flow path 414 of the tank main body 410.

The sealing of the outer peripheral surface of the filter 804 and the inner peripheral surface of the filter case 800 and the fixing of the fixing member 806 suppress leakage of the target substance from between the outer peripheral surface of the filter 804 and the inner peripheral surface of the filter case 800 to the outside of the filter case 800. The fixing member 806 may be omitted as long as the leakage of the target substance is suppressed only by sealing the outer peripheral surface of the filter 804 and the inner peripheral surface of the filter case 800. In this case, the inner peripheral surface of the sealing portion 510 on the tank main body 410 side may be continuous with the inner peripheral surface of the tank main body 410 at the tank flow path 414 of the tank main body 410 as in the first embodiment.

The material of the filter case 800 and the material of the fixing member 806 is the same as that of the tank main body 410 and the nozzle 42. The material of the filter case 800 and the fixing member 806 is preferably the same as that of the tank main body 410 and the nozzle 42, but may be different from the material of the tank main body 410 and the material of the nozzle 42 as long as the material has low reactivity with tin. The thermal expansion coefficient of the filter case 800 and the fixing member 806 is preferably the same as that of the tank main body 410 and the nozzle 42.

The filter case 800 includes an upper surface 810a facing the bottom surface 410a and a bottom surface 82a facing the upper surface 42a.

The fastening members 600 of the present embodiment are disposed for the tank main body 410 and the filter case 800, as well as for the filter case 800 and the nozzle 42. For convenience of description, the fastening members 600 will be described as fastening members 600a and 600b. The configuration of the fastening members 600a and 600b is the same as that of the fastening member 600.

The plurality of fastening members 600a fasten the filter case 800 and the tank main body 410 to each other such that the tank flow path 414 and the case flow path 802 communicate with each other. The fastening members 600a are arranged at equal intervals around the center axis of the tank flow path 414.

The thermal expansion coefficient of the fastening members 600a is the same as that of each of the tank main body 410 and the filter case 800.

The plurality of fastening members 600b fasten the filter case 800 and the nozzle 42 to each other so that the case flow path 802 and the nozzle flow path 424 communicate with each other. The fastening members 600b are arranged at equal intervals around the center axis of the nozzle flow path 424. The fastening members 600b are disposed at the inner side of the fastening members 600a. The fastening members 600b may be disposed at the outer side of the fastening members 600a.

The thermal expansion coefficient of the fastening members 600b is the same as that of each of the filter case 800 and the nozzle 42.

Here, the tank main body 410 and the filter case 800 fastened by the fastening members 600a will be described. In the tank main body 410 and the filter case 800, in the target supply device 40 of the present embodiment, similarly to the target supply device 40 of the first embodiment, the first containing member and the first flow path member are the tank main body 410, and the first flow path is the tank flow path 414. In the tank main body 410 and the filter case 800, in the target supply device 40 of the present embodiment, the second containing member and the second flow path member are the filter case 800, and the second flow path is the case flow path 802. The first surface is the bottom surface 410a of the tank main body 410, and the second surface is the upper surface 810a of the filter case 800. Accordingly, the filter case 800 corresponds to the nozzle 42 of the first embodiment, the case flow path 802 corresponds to the nozzle flow path 424 of the first embodiment, and the upper surface 810a corresponds to the upper surface 42a of the first embodiment. The configuration of the upper surface 810a is the same as that of the upper surface 42a of the first embodiment.

Similarly to the sealing portion 510 of the first embodiment, the sealing portion 510 is continuous with the bottom surface 410a of the tank main body 410. The sealing portion 510 is located on the circumference of a circle centered on the center axis of the communication portion 440a between the tank flow path 414 and the case flow path 802, and surrounds the entire circumference of the communication portion 440a. The sealing portion 510 is located between the communication portion 440a and the fastening members 600a in the radial direction of the sealing portion 510. The plurality of fastening members 600a press the filter case 800 toward the tank main body 410 to fasten the filter case 800 and the tank main body 410 to each other. The fastening members 600a press the upper surface 810a against the sealing portion 510 by fastening. The sealing portion 510 is plastically deformed by being pressed against the upper surface 810a by the fastening members 600a. The sealing portion 510 is plastically deformed to seal the gap between the bottom surface 410a and the upper surface 810a around the communication portion 440a between the nozzle flow path 424 and the case flow path 802.

Next, the filter case 800 and the nozzle 42 fastened by the fastening members 600b will be described. In the filter case 800 and the nozzle 42, in the target supply device 40 of the present embodiment, similarly to the target supply device 40 of the second embodiment, the second containing member and the second flow path member are the nozzle 42, and the second flow path is the nozzle flow path 424. In the filter case 800 and the nozzle 42, in the target supply device 40 of the present embodiment, the first containing member and the first flow path member are the filter case 800, and the first flow path is the case flow path 802. The first surface is the bottom surface 82a of the filter case 800, and the second surface is the upper surface 42a of the nozzle 42. Therefore, the filter case 800 corresponds to the tank main body 410 of the second embodiment, the case flow path 802 corresponds to the tank flow path 414 of the second embodiment, and the bottom surface 82a corresponds to the bottom surface 410a of the second embodiment. The configuration of the bottom surface 82a is the same as that of the bottom surface 410a of the second embodiment.

The configuration of the nozzle 42 of the present embodiment is the same as that of the nozzle 42 of the second embodiment. Therefore, the sealing portion 510 is continuous with the upper surface 42a of the nozzle 42, similarly to the sealing portion 510 of the second embodiment. The sealing portion 510 is located on the circumference of a circle centered on the center axis of the communication portion 440b between the case flow path 802 and the nozzle flow path 424, and surrounds the entire circumference of the communication portion 440b. Further, the sealing portion 510 is located between the communication portion 440b and the fastening members 600b in the radial direction of the sealing portion 510. The plurality of fastening members 600b press the nozzle 42 toward the filter case 800 to fasten the nozzle 42 and the filter case 800 to each other. The fastening members 600b press the sealing portion 510 against the bottom surface 82a by fastening. The sealing portion 510 is plastically deformed by being pressed against the bottom surface 82a by the fastening members 600b. The sealing portion 510 is plastically deformed to seal the gap between the bottom surface 82a and the upper surface 42a around the communication portion 440b between the case flow path 802 and the nozzle flow path 424.

7.2 Effect

In the target supply device 40 of the present embodiment, in the tank main body 410 and the filter case 800, the first containing member is the tank main body 410, and the second containing member is the filter case 800. The sealing portion 510 is formed integrally with the tank main body 410, extends from the bottom surface 410a toward the upper surface 810a, and is in close contact with the upper surface 810a. The fastening members 600a press the upper surface 810a against the sealing portion 510. The sealing portion 510 is plastically deformed by being pressed against the upper surface 810a by the fastening members 600a, and seals the gap between the bottom surface 410a and the upper surface 810a around the communication portion 440a by the plastic deformation.

The relationship between the sealing portion 510 of the tank main body 410 and the filter case 800 pressed against the sealing portion 510 in the present embodiment is the same as that between the sealing portion 510 and the nozzle 42 pressed against the sealing portion 510 in the first embodiment. Therefore, the operation and effect obtained by the relationship between the sealing portion 510 and the filter case 800 in the present embodiment are the same as those obtained by the relationship between the sealing portion 510 and the nozzle 42 in the first embodiment. In this manner, in the target supply device 40 of the present embodiment, even when the filter case 800 is fastened to the tank main body 410, it is possible to obtain the same operation and effect as in the case where the sealing portion 510 is pressed against the nozzle 42 as shown in the first embodiment.

Further, in the target supply device 40 of the present embodiment, in the filter case 800 and the nozzle 42, the first containing member is the filter case 800 and the second containing member is the nozzle 42. The sealing portion 510 is formed integrally with the nozzle 42, extends from the upper surface 42a toward the bottom surface 82a, and is in close contact with the bottom surface 410a. The fastening members 600b press the sealing portion 510 against the bottom surface 82a. The sealing portion 510 is plastically deformed by being pressed against the bottom surface 82a by the fastening members 600b, and seals the gap between the bottom surface 82a and the upper surface 42a around the communication portion 440b by the plastic deformation.

The relationship between the sealing portion 510 of the nozzle 42 and the filter case 800 pressed by the sealing portion 510 in the present embodiment is the same as that between the sealing portion 510 and the tank main body 410 pressed by the sealing portion 510 in the second embodiment. Therefore, the operation and effect obtained by the relationship between the sealing portion 510 of the nozzle 42 and the filter case 800 in the present embodiment are the same as those obtained by the relationship between the sealing portion 510 and the tank main body 410 in the second embodiment. As described above, in the target supply device 40 of the present embodiment, even when the filter case 800 is fastened to the nozzle 42, it is possible to obtain the same operation and effect as in the case where the sealing portion 510 is pressed against the tank main body 410 as shown in the second embodiment.

Although the above embodiments have been described as examples, the present disclosure is not limited thereto and can be modified as appropriate.

Figure 9:
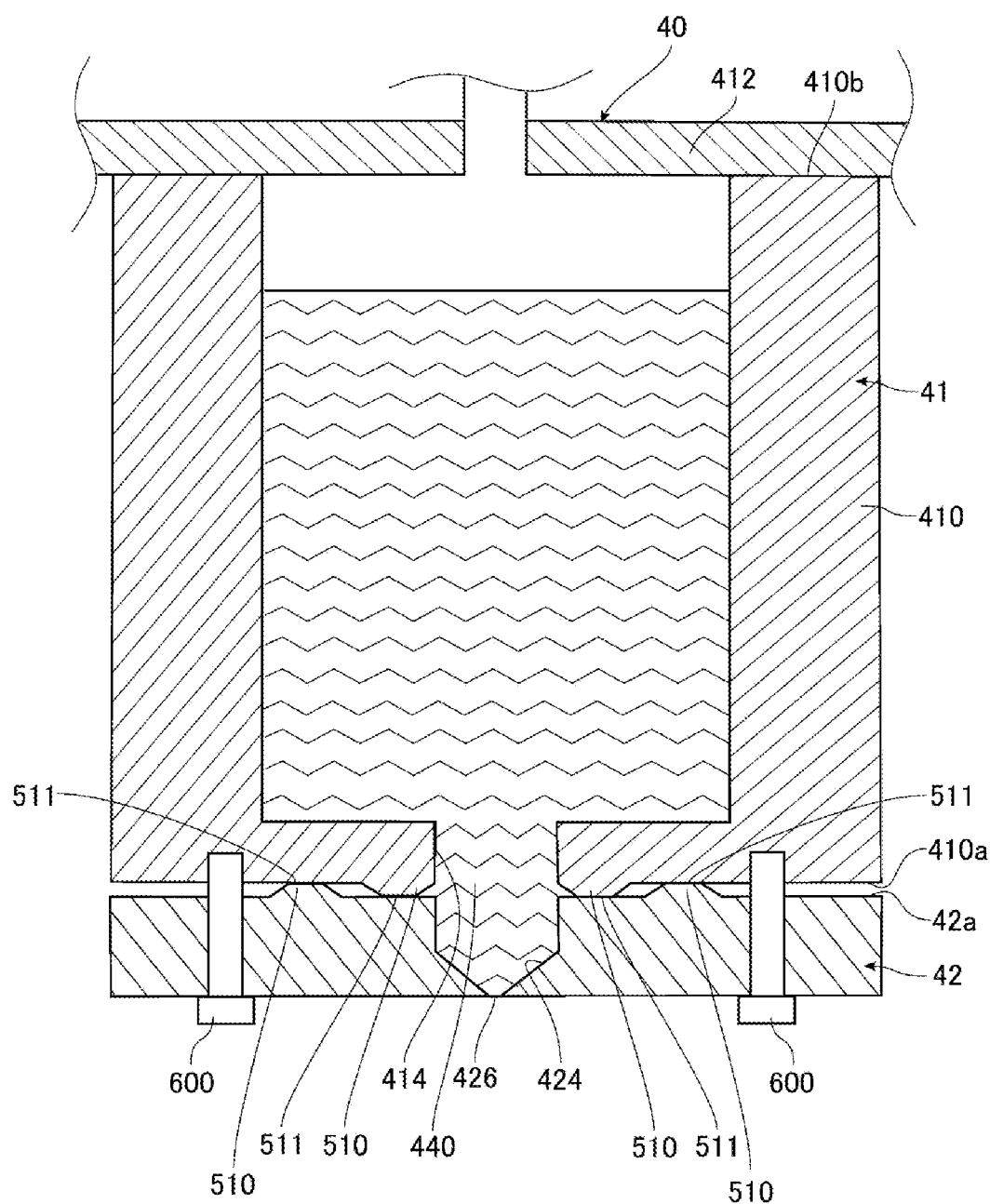
FIG. 9 is a schematic view showing an exemplary schematic configuration of a part including a target supply device of a modification of the first embodiment and the second embodiment.

As a modification of the first embodiment and the second embodiment, as shown in FIG. 9, the target supply device 40 may include the tank main body 410 of the first embodiment and the nozzle 42 of the second embodiment, and the tank main body 410 of the first embodiment and the nozzle 42 of the second embodiment may be fastened to each other. Therefore, the sealing portion 510 is formed integrally with each of the tank main body 410 which is the first containing member as in the first embodiment and the nozzle 42 which is the second containing member as in the second embodiment. One of the two sealing portions 510 is located at the outer side of the other sealing portion 510 in the radial direction of the sealing portion 510. In FIG. 9, the sealing portion 510 of the nozzle 42 is located at the outer side of the sealing portion 510 of the tank main body 410, but the positions of the respective sealing portions 510 may be reversed. Since the sealing portions 510 are arranged in a double manner, the sealing effect is enhanced. Note that the two sealing portions 510 may be arranged in the center axis direction of the sealing portion 510, and one sealing portion 510 may be in close contact with the other sealing portion 510. In the first embodiment, the second embodiment, and the modification described above, it can be understood that the sealing portion 510 is formed integrally with at least one of the tank main body 410 and the nozzle 42 which are disposed apart from each other, extends from the one toward the other, and is in close contact with the other located on the extending side.

For forming the sealing portion 510, a member including the sealing portion 510 out of the tank main body 410 and the nozzle 42 is processed by cutting. The processing may generate shavings from the member, and the shavings may accumulate in the flow path of the member. The accumulated shavings are removed by cleaning the member including the flow path, and accumulation of the shavings in the flow path is suppressed. Since the shavings are fine, in a case where the sealing portion 510 is a part of the nozzle 42, even when the nozzle 42 is cleaned, some of the shavings remain in the nozzle hole 426 to cause clogging at the nozzle hole 426. Therefore, the sealing portion 510 is preferably a part of the tank main body 410, rather than the nozzle 42, including the tank flow path 414 having a diameter larger than the diameter of the nozzle hole 426.

Figure 10:
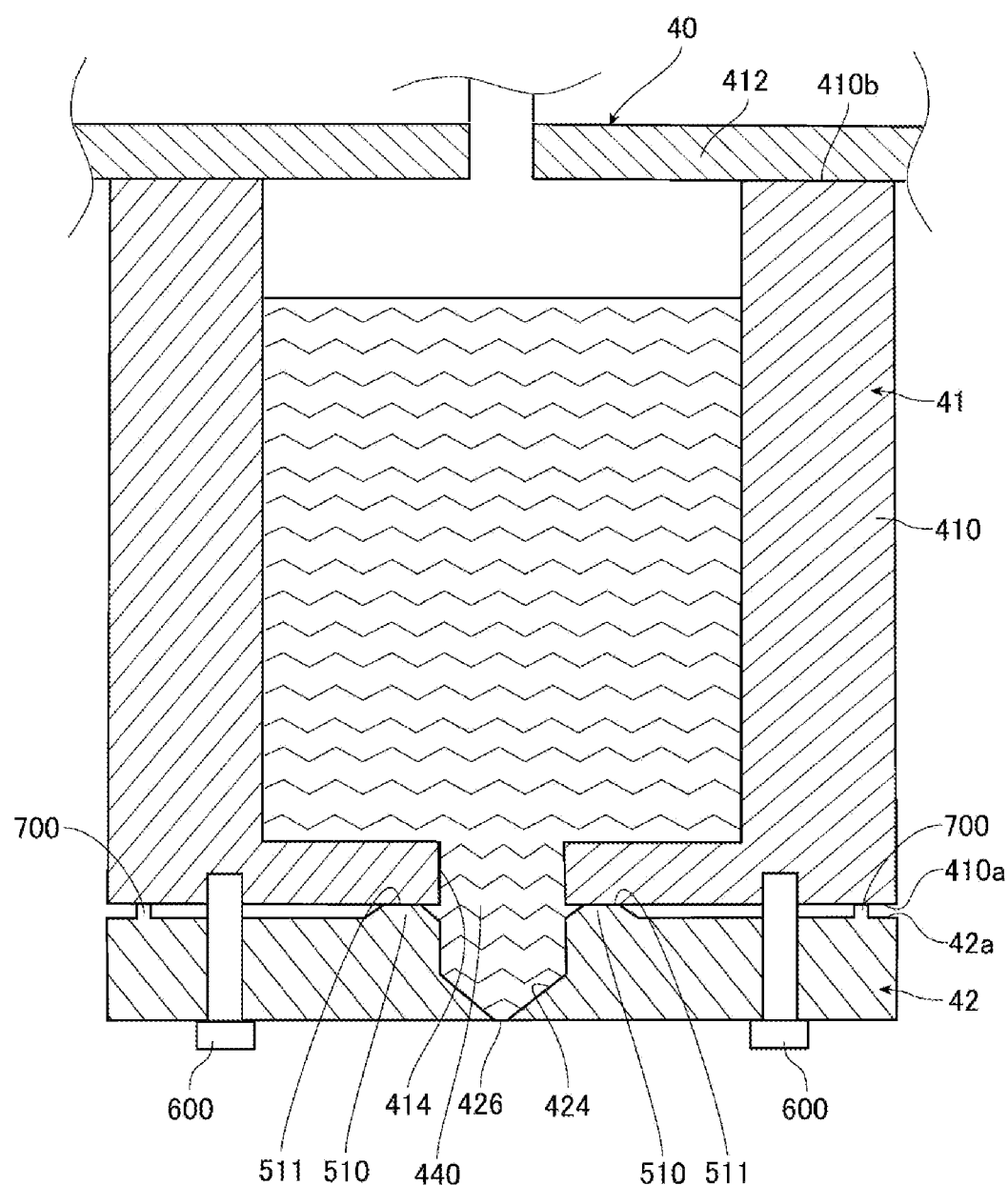
FIG. 10 is a schematic view showing an exemplary schematic configuration of a part including a target supply device of a first modification of the third embodiment.

As a first modification of the third embodiment, as shown in FIG. 10, in the target supply device 40 of the second embodiment, the extending portion 700 may be integrally formed with the nozzle 42 which is the second containing member of the second embodiment, and may be continuous with the upper surface 42a which is the second surface.

Figure 11:
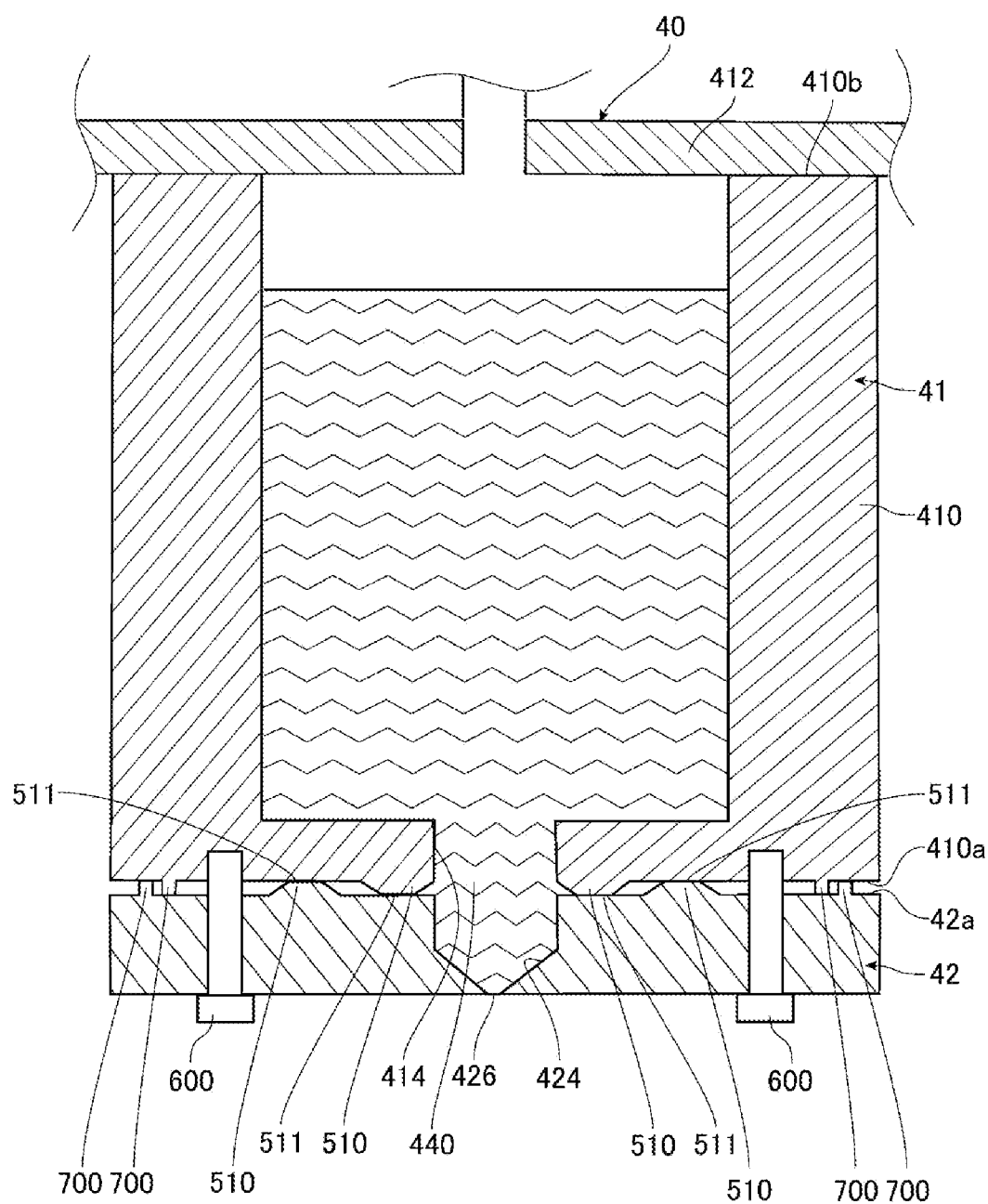
FIG. 11 is a schematic view showing an exemplary schematic configuration of a part including a target supply device of a second modification of the third embodiment.

As a second modification of the third embodiment, as shown in FIG. 11, the extending portion 700 may be integrally formed with each of the tank main body 410 and the nozzle 42 of the modification of the first embodiment and the second embodiment, and may be continuous with each of the bottom surface 410a and the upper surface 42a. In the present modification, the extending portion 700 does not need to be continuous with each of the bottom surface 410a and the upper surface 42a, but may be continuous with only one of the bottom surface 410a and the upper surface 42a.

According to the extending portion 700 of the third embodiment and the first and second modifications of the third embodiment, it can be understood that the extending portion 700 is integrally formed with the containing member including the sealing portion 510 out of the tank main body 410 which is the first containing member and the nozzle 42 which is the second containing member, and extends from the containing member toward another containing member different from the containing member.

As a third modification of the third embodiment, the extending portion 700 may be formed integrally with the nozzle 42 of the first embodiment in the target supply device 40 of the first embodiment and may be continuous with the upper surface 42a, or may be formed integrally with the tank main body 410 of the second embodiment in the target supply device 40 of the second embodiment and may be continuous with the bottom surface 410a. Therefore, it can be understood that the extending portion 700 is integrally formed with a member of the tank main body 410 and the nozzle 42 which does not include the sealing portion 510.

Figure 12:
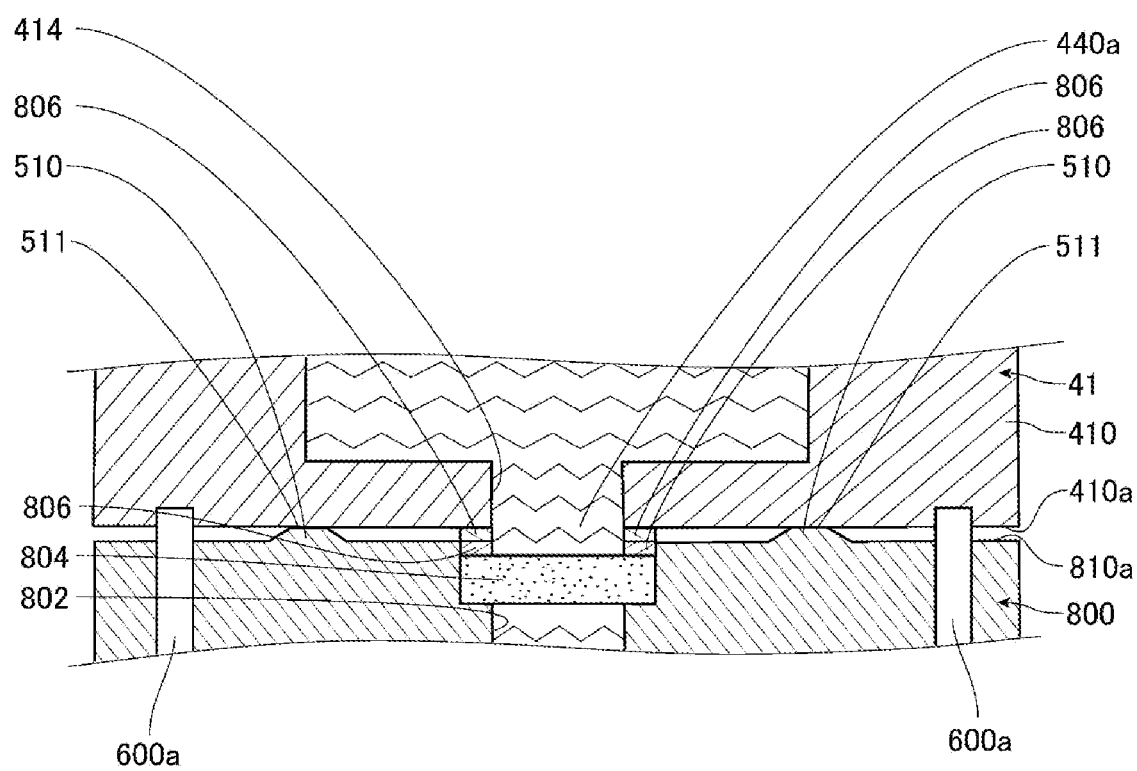
FIG. 12 is a view showing a first modification of the fourth embodiment.

As a first modification of the fourth embodiment, as shown in FIG. 12, in the tank main body 410 and the filter case 800, the configuration of the tank main body 410 is the same as that of the tank main body 410 of the second embodiment. Further, the sealing portion 510 in the present modification is configured as a part of the filter case 800 which is the second containing member, and is formed integrally with the filter case 800, and is continuous with the upper surface 810a which is the second surface. The relationship between the sealing portion 510 and the tank main body 410 pressed against the sealing portion 510 in the present modification is the same as that between the sealing portion 510 and the filter case 800 pressed against the sealing portion 510 in the fourth embodiment. Therefore, the operation and effect obtained by the relationship between the sealing portion 510 and the tank main body 410 in the present modification are the same as those obtained by the relationship between the sealing portion 510 and the filter case 800 in the fourth embodiment. Further, the relationship between the filter case 800 and the sealing portion 510 which is integrally formed in the filter case 800 in the present modification is the same as that between the tank main body 410 and the sealing portion 510 which is integrally formed in the tank main body 410 in the fourth embodiment. Therefore, the operation and effect obtained by the relationship between the filter case 800 and the sealing portion 510 in the present modification are the same as those obtained by the relationship between the tank main body 410 and the sealing portion 510 in the fourth embodiment.

Figure 13:
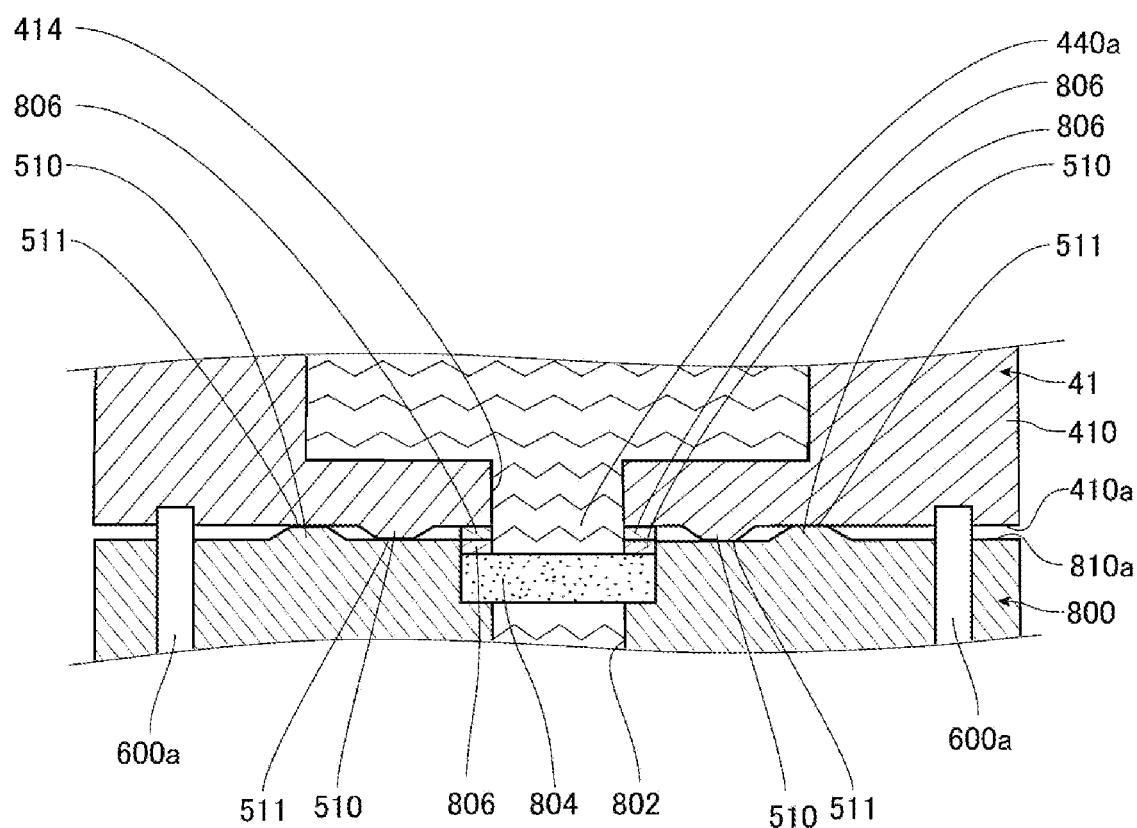
FIG. 13 is a view showing a second modification of the fourth embodiment.

As a second modification of the fourth embodiment, as shown in FIG. 13, in the tank main body 410 and the filter case 800, the target supply device 40 may include the tank main body 410 of the fourth embodiment and the filter case 800 of the first modification of the fourth embodiment, and the tank main body 410 of the fourth embodiment and the filter case 800 of the first modification of the fourth embodiment may be fastened to each other. Therefore, in the second modification of the fourth embodiment, the sealing portion 510 is formed integrally with each of the tank main body 410 which is the first containing member as in the fourth embodiment and the filter case 800 which is the second containing member as in the first modification of the fourth embodiment. One of the two sealing portions 510 is located at the outer side of the other sealing portion 510 in the radial direction of the sealing portion 510. Note that the two sealing portions 510 may be arranged in the center axis direction of the sealing portion 510, and one sealing portion 510 may be in close contact with the other sealing portion 510.

It can be understood that the sealing portion 510 is formed integrally with at least one of the tank main body 410 which is the first containing member and the filter case 800 which is the second containing member depending on the position of the sealing portion 510 in the fourth embodiment and the first and second modifications of the fourth embodiment.

Figure 14:
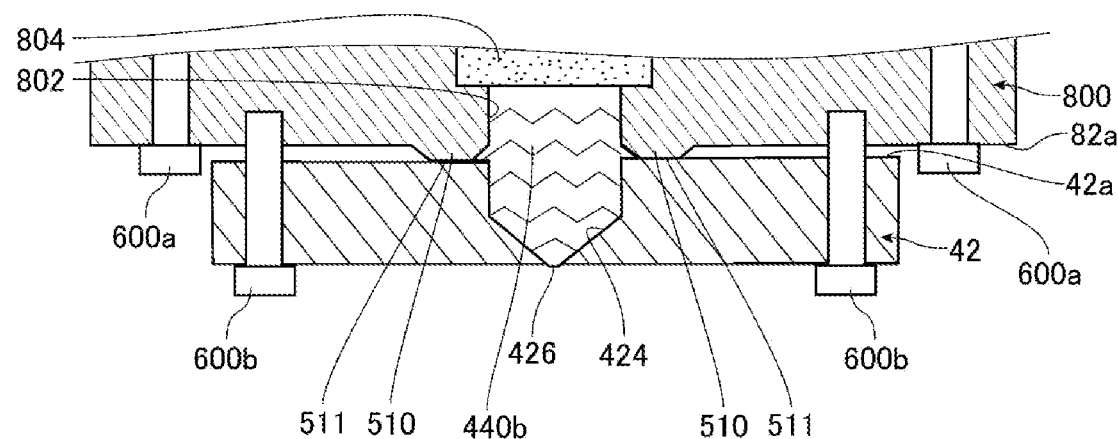
FIG. 14 is a view showing a third modification of the fourth embodiment.

As a third modification of the fourth embodiment, as shown in FIG. 14, in the filter case 800 and the nozzle 42, the configuration of the nozzle 42 is the same as that of the nozzle 42 of the first embodiment. The sealing portion 510 is configured as a part of the filter case 800 which is the first containing member, is integrally formed with the filter case 800, and is continuous with the bottom surface 82a which is the first surface. The relationship between the sealing portion 510 and the nozzle 42 pressed against the sealing portion 510 in the present modification is the same as that between the sealing portion 510 and the filter case 800 pressed against the sealing portion 510 in the fourth embodiment. Therefore, the operation and effect obtained by the relationship between the sealing portion 510 and the nozzle 42 in the present modification are the same as those obtained by the relationship between the sealing portion 510 and the filter case 800 in the fourth embodiment. The relationship between the filter case 800 and the sealing portion 510 integrally formed with the filter case 800 in the present modification is the same as that between the nozzle 42 and the sealing portion 510 integrally formed with the nozzle 42 in the fourth embodiment. Therefore, the operation and effect obtained by the relationship between the filter case 800 and the sealing portion 510 in the present modification are the same as those obtained by the relationship between the nozzle 42 and the sealing portion 510 in the fourth embodiment.

Figure 15:
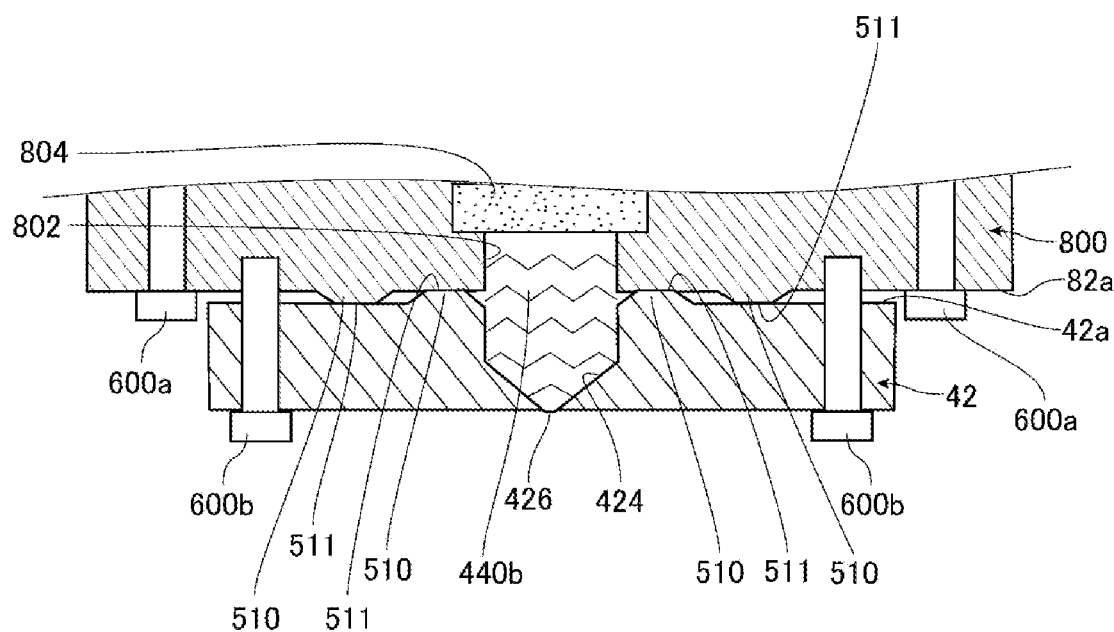
FIG. 15 is a view showing a fourth modification of the fourth embodiment.

As a fourth modification of the fourth embodiment, as shown in FIG. 15, in the filter case 800 and the nozzle 42, the target supply device 40 may include the nozzle 42 of the fourth embodiment and the filter case 800 of the third modification of the fourth embodiment, and the nozzle 42 of the fourth embodiment and the filter case 800 of the third modification of the fourth embodiment may be fastened to each other. Therefore, in the fourth modification of the fourth embodiment, the sealing portion 510 is formed integrally with each of the filter case 800 which is the first containing member as in the third modification of the fourth embodiment and the nozzle 42 which is the second containing member as in the fourth embodiment. One of the two sealing portions 510 is located at the outer side of the other sealing portion 510 in the radial direction of the sealing portion 510. Note that the two sealing portions 510 may be arranged in the center axis direction of the sealing portion 510, and one sealing portion 510 may be in close contact with the other sealing portion 510.

It can be understood that the sealing portion 510 is integrally formed with at least one of the filter case 800 which is the first containing member and the nozzle 42 which is the second containing member, depending on the position of the sealing portion 510 in the fourth embodiment and the third and fourth modifications of the fourth embodiment.

Figure 16:
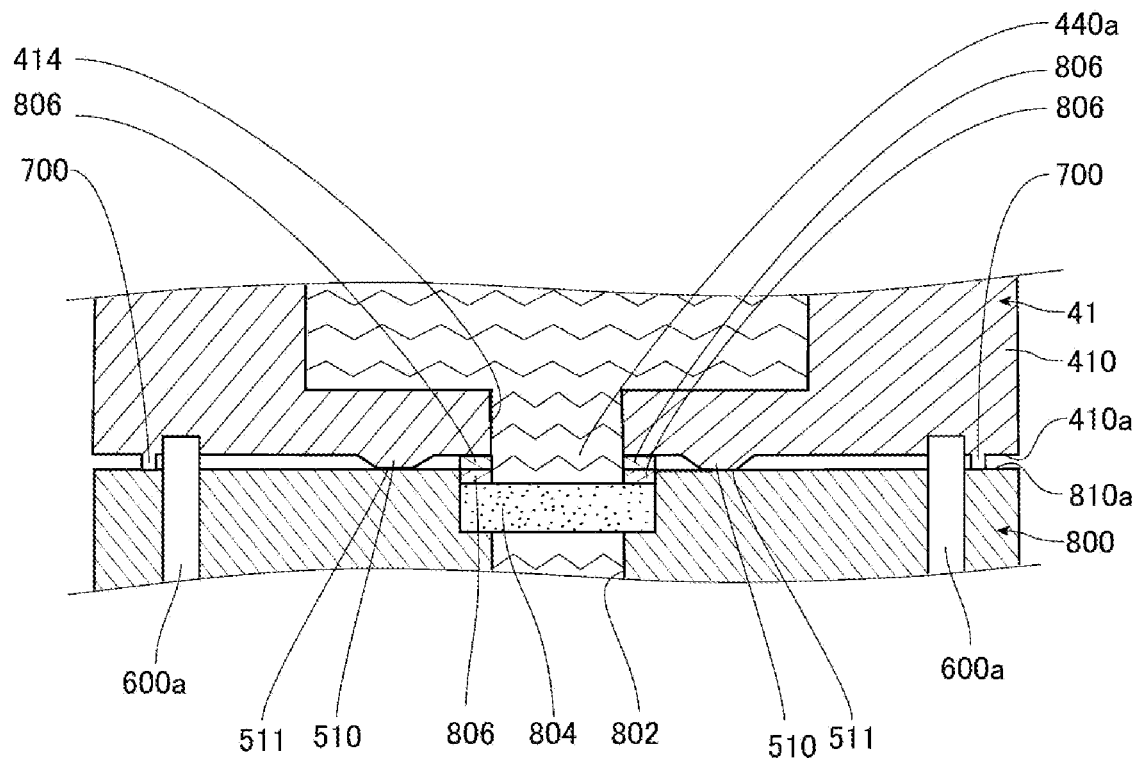
FIG. 16 is a view showing an example of a fifth modification of the fourth embodiment.
Figure 17:
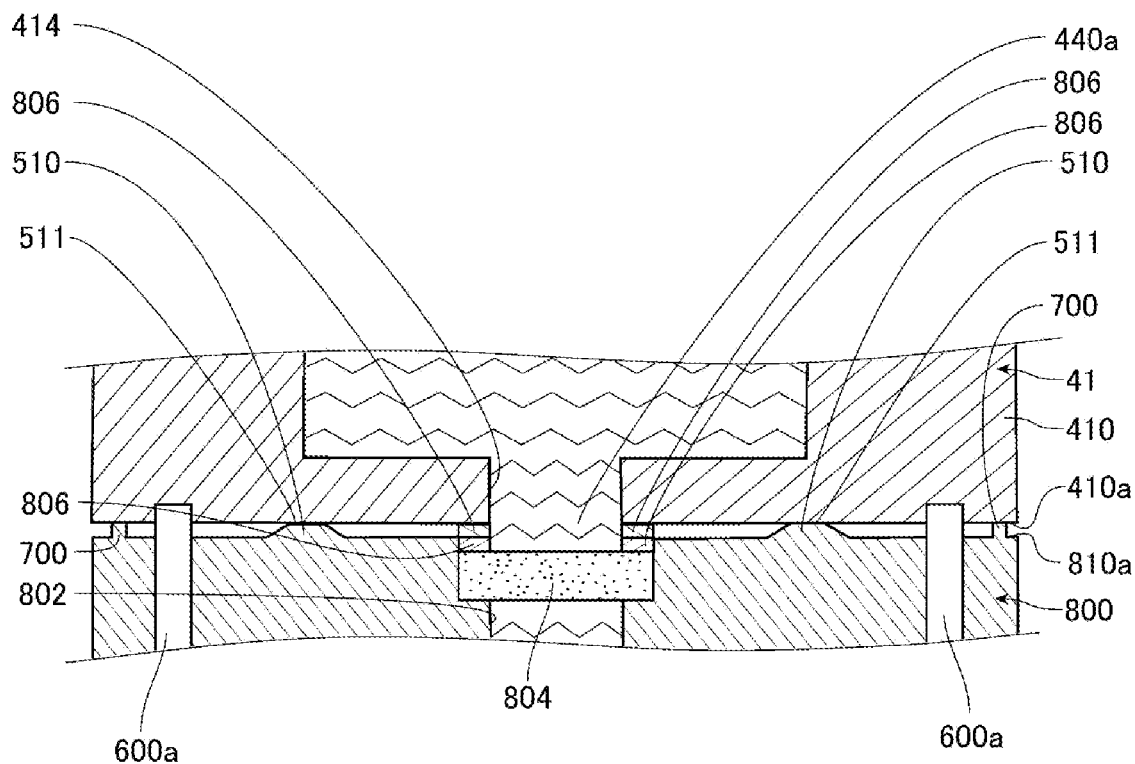
FIG. 17 is a view showing another example of the fifth modification of the fourth embodiment.
Figure 18:
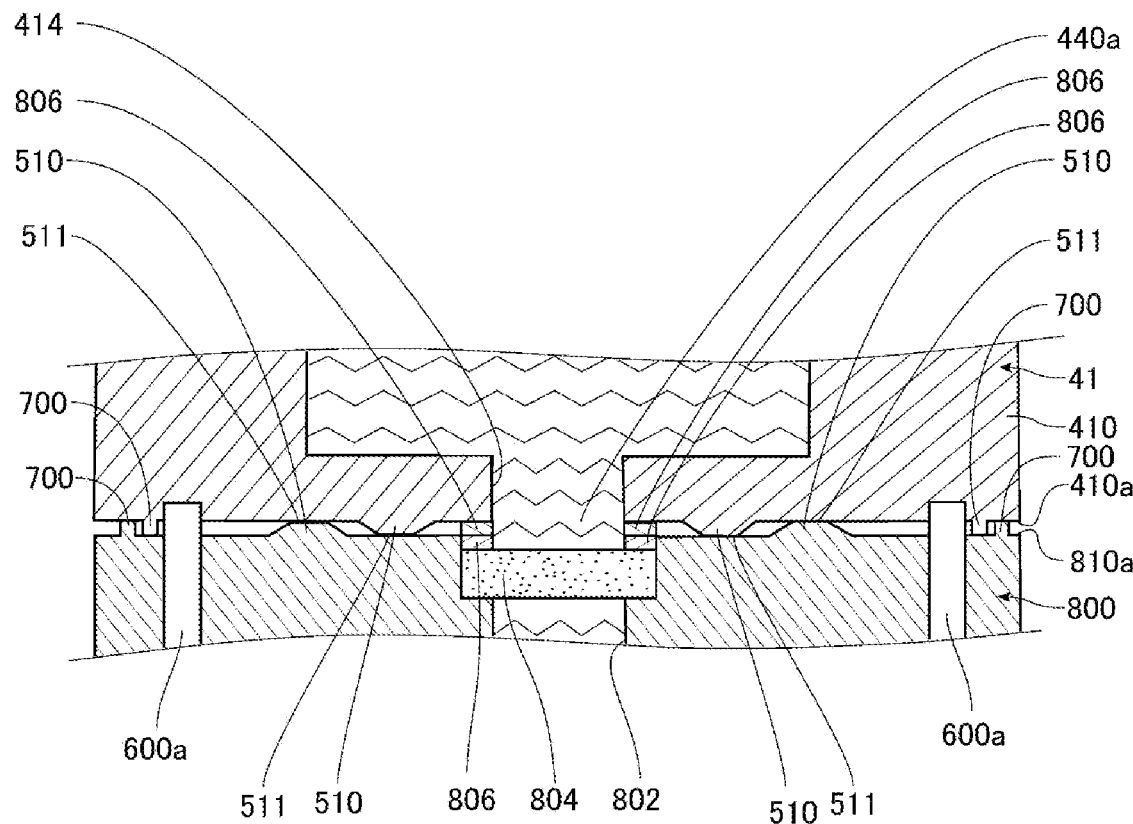
FIG. 18 is a view showing another example of the fifth modification of the fourth embodiment.

As a fifth modification of the fourth embodiment, as shown in FIGS. 16, 17, and 18, the extending portion 700 may be integrally formed with the containing member including the sealing portion 510 among the tank main body 410 which is the first containing member and the filter case 800 which is the second containing member. The configuration of the tank main body 410 and the filter case 800 shown in FIG. 16 is the same as that of the tank main body 410 and the filter case 800 of the fourth embodiment. The configuration of the tank main body 410 and the filter case 800 shown in FIG. 17 is the same as that of the tank main body 410 and the filter case 800 of the first modification of the fourth embodiment. The configuration of the tank main body 410 and the filter case 800 shown in FIG. 18 is the same as that of the tank main body 410 and the filter case 800 of the second modification of the fourth embodiment. In the modification shown in FIG. 18, the extending portion 700 does not need to be continuous with each of the bottom surface 410a and the upper surface 810a, but may be continuous with either one of the bottom surface 410a and the upper surface 810a.

Figure 19:
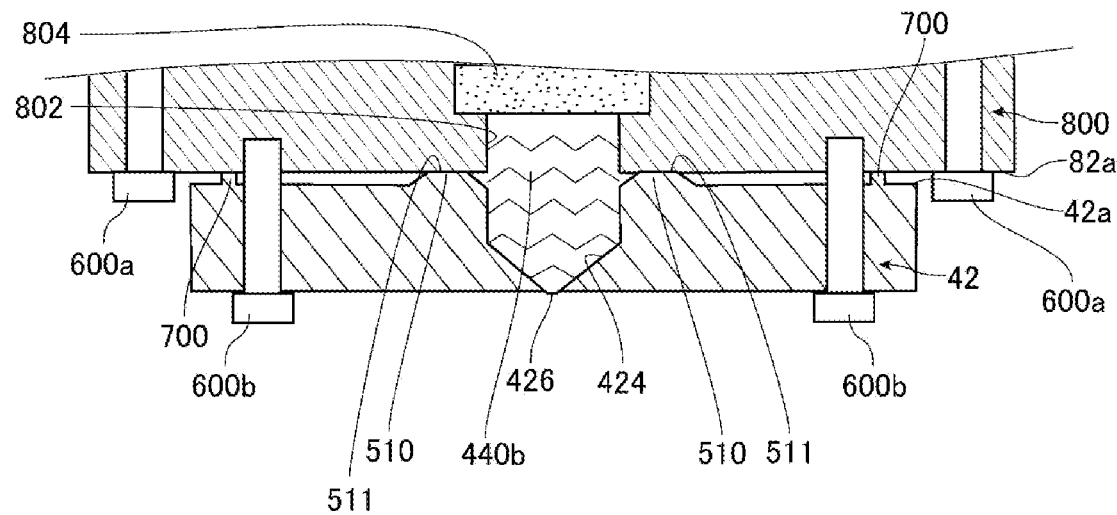
FIG. 19 is a view showing an example of a sixth modification of the fourth embodiment.
Figure 20:
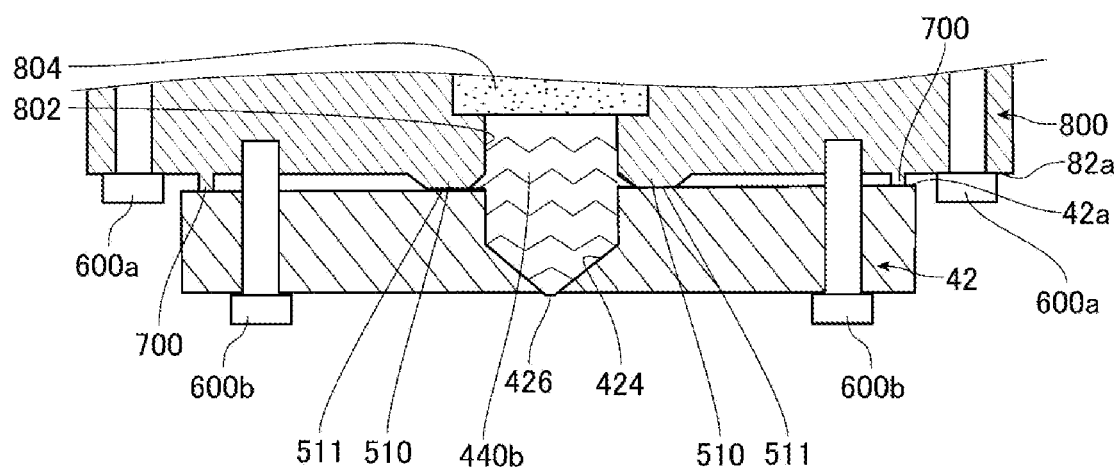
FIG. 20 is a view showing another example of the sixth modification of the fourth embodiment.
Figure 21:
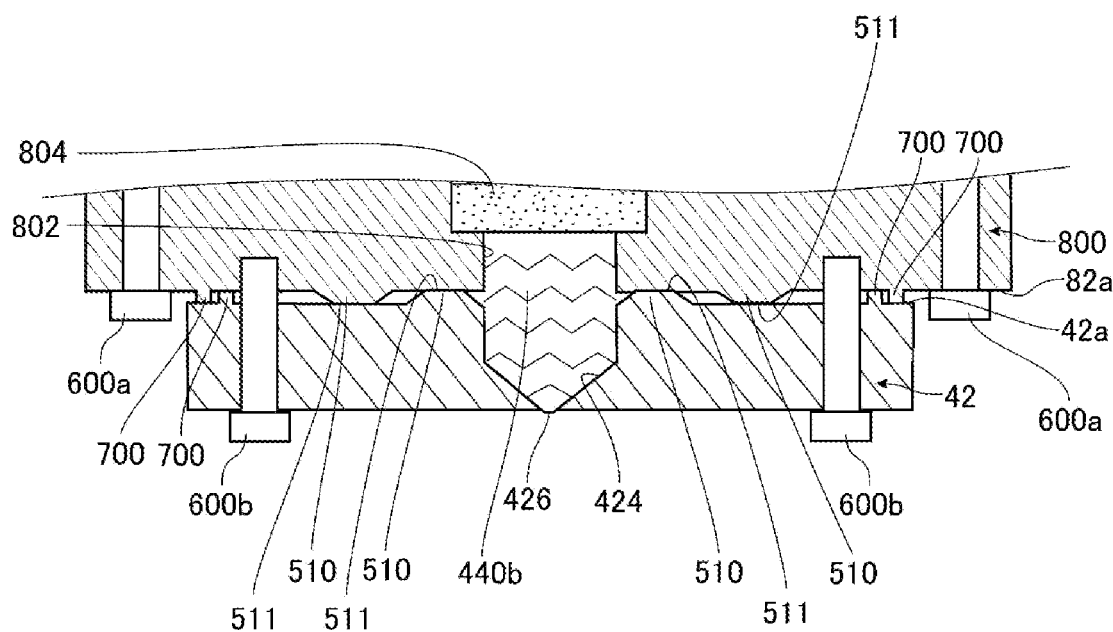
FIG. 21 is a view showing another example of the sixth modification of the fourth embodiment.

As a sixth modification of the fourth embodiment, as shown in FIGS. 19, 20, and 21, the extending portion 700 may be integrally formed with the containing member including the sealing portion 510 among the filter case 800 which is the first containing member and the nozzle 42 which is the second containing member. The configuration of the nozzle 42 and the filter case 800 shown in FIG. 19 is the same as that of the nozzle 42 and the filter case 800 of the fourth embodiment. The configuration of the nozzle 42 and the filter case 800 shown in FIG. 20 is the same as that of the nozzle 42 and the filter case 800 of the third modification of the fourth embodiment. The configuration of the nozzle 42 and the filter case 800 shown in FIG. 21 is the same as that of the nozzle 42 and the filter case 800 of the fourth modification of the fourth embodiment. In the modification shown in FIG. 21, the extending portion 700 does not need to be continuous with each of the bottom surface 82a and the upper surface 42a, but may be continuous only with either one of the bottom surface 82a and the upper surface 42a.

As a seventh modification of the fourth embodiment, the extending portion 700 may be integrally formed with the containing member which does not include the sealing portion 510 among the tank main body 410 which is the first containing member and the filter case 800 which is the second containing member.

As an eighth modification of the fourth embodiment, the extending portion 700 may be integrally formed with the containing member which does not include the sealing portion 510 among the filter case 800 which is the first containing member and the nozzle 42 which is the second containing member.

In the fourth embodiment and each modified example of the fourth embodiment, the sealing portion 510 does not need to be on both the side of the tank main body 410 and the filter case 800 and the side of the filter case 800 and the nozzle 42 which is the second containing member, and may be located on either one of the sides.

For the plastic deformation of the sealing portion 510, there may be difference in hardness among the tank main body 410, the filter case 800, and the nozzle 42.

The tank main body 410, the filter case 800, and the nozzle 42 may be fastened by one fastening member 600.

The tank main body 410 may be cylindrical, and the internal space of the tank main body 410 may communicate with the nozzle flow path 424. In this case, the internal space of the tank main body 410 is the first flow path. Further, the sealing portion 510 may be continuous to the end face of the tank main body 410 facing the upper surface 42a.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:
1. A target supply device, comprising:
a first containing member configured to contain a target substance;
a second containing member configured to contain the target substance flowing from the first containing member;
a ring-shaped sealing portion which is formed integrally with one of the first containing member and the second containing member, extends from the one containing member toward the other containing member, surrounds entire circumference of a communication portion between the first containing member and the second containing member, and is brought into close contact with the other containing member; and
a fastening member which fastens the first containing member and the second containing member to each other so that the first containing member communicates with the second containing member through the communication portion, and presses the sealing portion against the other containing member, the sealing portion being plastically deformed by being pressed against the other containing member by the fastening member to seal a gap between the first containing member and the second containing member around the communication portion due to the plastic deformation.

2. The target supply device according to claim 1, wherein surface pressure P at a close-contact surface of the sealing portion in close contact with the other containing member is calculated as P=Pi(1+α), where Pi denotes internal pressure in the gap sealed by the sealing portion and a denotes a safety coefficient.

3. The target supply device according to claim 1, wherein an outer diameter of the sealing portion gradually decreases from the one containing member toward the other containing member, and an inner diameter of the sealing portion gradually increases from the one containing member toward the other containing member.

4. The target supply device according to claim 1, wherein an inner peripheral surface of the sealing portion is continuous with an inner peripheral surface of the one containing member.

5. The target supply device according to claim 1, wherein a surface of the one containing member with which the sealing portion is continuous is a flat surface, and is spaced apart from the other containing member more than a close-contact surface of the sealing portion.

6. The target supply device according to claim 1, wherein a close-contact surface of the sealing portion in close contact with the other containing member and a surface of the other containing member with which the close-contact surface is in close contact are flat surfaces.

7. The target supply device according to claim 1, wherein thermal expansion coefficients of the first containing member, the second containing member, and the fastening member are the same as each other.

8. The target supply device according to claim 1, wherein the fastening member is disposed at an outer side of the sealing portion in a radial direction of the sealing portion.

9. The target supply device according to claim 1, further comprising an extending portion which is formed integrally with the one containing member and extends from the one containing member toward the other containing member, wherein the extending portion is spaced apart from the other containing member more than the sealing portion in a state before the one containing member and the other containing member are fastened, and brought into contact with the other containing member as following the sealing portion due to fastening of the one containing member and the other containing member.

10. The target supply device according to claim 9, wherein the fastening member is located at an outer side of the sealing portion in a radial direction of the sealing portion, and
the extending portion has a ring shape, is located at an outer side of the fastening member in the radial direction of the sealing portion, and surrounds entire circumference of the sealing portion and the fastening member.

11. The target supply device according to claim 1, wherein the first containing member is a tank main body which stores the target substance at an internal space thereof, and
the second containing member is a nozzle which is fastened to the tank main body and configured to output the target substance flowing from the tank main body.

12. The target supply device according to claim 1, wherein the first containing member is a tank main body which stores the target substance at an internal space thereof, and
the second containing member is a filter case which is fastened to the tank main body as being located between the tank main body and a nozzle configured to output the target substance.

13. The target supply device according to claim 1, wherein the first containing member is a filter case into which the target substance flows from the tank main body storing the target substance at an internal space thereof, and
the second containing member is a nozzle which is fastened to the filter case and configured to output the target substance flowing from the filter case.

14. An extreme ultraviolet light generation apparatus, comprising:
a chamber device including a plasma generation region;
a target supply device configured to supply a target substance to the plasma generation region; and
a laser device configured to irradiate the target substance with laser light so that plasma is generated from the target substance in the plasma generation region,
the target supply device including a first containing member configured to contain the target substance; a second containing member configured to contain the target substance flowing from the first containing member; a ring-shaped sealing portion which is formed integrally with one of the first containing member and the second containing member, extends from the one containing member toward the other containing member, surrounds entire circumference of a communication portion between the first containing member and the second containing member, and is brought into close contact with the other containing member; and a fastening member which fastens the first containing member and the second containing member to each other so that the first containing member communicates with the second containing member through the communication portion, and presses the sealing portion against the other containing member, and
the sealing portion being plastically deformed by being pressed against the other containing member by the fastening member to seal a gap between the first containing member and the second containing member around the communication portion due to the plastic deformation.

15. An electronic device manufacturing method, comprising:
generating plasma by irradiating a target substance with laser light using an extreme ultraviolet light generation apparatus;
emitting extreme ultraviolet light generated from the plasma to an exposure apparatus; and
exposing a photosensitive substrate to the extreme ultraviolet light in the exposure apparatus to manufacture an electronic device,
the extreme ultraviolet light generation apparatus including a chamber device including a plasma generation region; a target supply device configured to supply the target substance to the plasma generation region; and a laser device configured to irradiate the target substance with the laser light so that the plasma is generated from the target substance in the plasma generation region, the target supply device including a first containing member configured to contain the target substance; a second containing member configured to contain the target substance flowing from the first containing member; a ring-shaped sealing portion which is formed integrally with one of the first containing member and the second containing member, extends from the one containing member toward the other containing member, surrounds entire circumference of a communication portion between the first containing member and the second containing member, and is brought into close contact with the other containing member; and a fastening member which fastens the first containing member and the second containing member to each other so that the first containing member communicates with the second containing member through the communication portion, and presses the sealing portion against the other containing member, and the sealing portion being plastically deformed by being pressed against the other containing member by the fastening member to seal a gap between the first containing member and the second containing member around the communication portion due to the plastic deformation.

* * * * *